(12) United States Patent
Kato et al.

(10) Patent No.: US 7,357,992 B2
(45) Date of Patent: Apr. 15, 2008

(54) ORGANIC EL DEVICES AND PRODUCTION PROCESS THEREOF

(75) Inventors: Tetsuya Kato, Anjo (JP); Kazushige Kojima, Aichi-gun (JP); Takanori Kajioka, Aichi-ken (JP); Masahiko Ishii, Toyota (JP)

(73) Assignee: Denso Corporation, Kariya (JP)

( * ) Notice: Subject to any disclaimer, the term of this patent is extended or adjusted under 35 U.S.C. 154(b) by 412 days.

(21) Appl. No.: 10/852,698

(22) Filed: May 25, 2004

(65) Prior Publication Data

US 2005/0064237 A1 Mar. 24, 2005

(30) Foreign Application Priority Data

| May 27, 2003 | (JP) | ................... 2003-149516 |
| Sep. 9, 2003 | (JP) | ................... 2003-316872 |
| Feb. 18, 2004 | (JP) | ................... 2004-041458 |

(51) Int. Cl.
*H01L 51/50* (2006.01)

(52) U.S. Cl. ............... 428/690; 428/917; 313/504; 313/506

(58) Field of Classification Search ........... 428/690, 428/917; 313/504, 506; 427/66
See application file for complete search history.

(56) References Cited

U.S. PATENT DOCUMENTS 5,281,489 A * 1/1994 Mori et al. ........... 428/690
5,635,308 A * 6/1997 Inoue et al. .......... 428/696
5,792,557 A 8/1998 Nakaya et al.
6,285,039 B1 9/2001 Kobori et al.
6,392,339 B1 * 5/2002 Aziz et al. ........... 313/504

FOREIGN PATENT DOCUMENTS

| JP | A-H08-48656 | 2/1996 |
| JP | A-2000-156290 | 6/2000 |
| WO | WO 98/08360 | 2/1998 |

* cited by examiner

*Primary Examiner*—Dawn L. Garrett
(74) *Attorney, Agent, or Firm*—Posz Law Group, PLC

(57) ABSTRACT

An organic electroluminescent device comprising a light-emitting layer between a pair of electrodes, the light-emitting layer comprising a mixture of a hole-transporting material consisting of a tertiary amine compound, an electron-transporting material and a light-emitting additive material, in which the tertiary amine compound has two or more oxidation potentials determined by a cyclic voltammetry wherein a potential difference between the first oxidation potential and the second oxidation potential in the oxidation potentials is 0.22V or more, and a glass transition temperature of at least 100° C., and the electron-transporting material has a glass transition temperature of at least 100° C.

6 Claims, 3 Drawing Sheets

ORGANIC EL DEVICES AND PRODUCTION PROCESS THEREOF

CROSS-REFERENCE TO RELATED APPLICATIONS

This application is based upon and claims priorities of Japanese Patent Application Nos. 2003-149516, filed May 27, 2003; 2003-316872, filed Sep. 9, 2003; and 2004-41458, filed Feb. 18, 2004, the contents being incorporated herein by reference.

BACKGROUND OF THE INVENTION

1. Field of the Invention

The present invention relates to an organic electroluminescent (EL) device and a production process thereof. More particularly, the present invention relates to an organic EL device, in which a mixed host comprising a mixture of a hole-transporting material and an electron-transporting material is used as a host material of the light-emitting layer, and a production process of such an organic EL device.

2. Description of the Related Art

The organic EL device can exhibit an excellent visibility because light is emitted based on a self-emission mechanism, and also its weight inclusive of the driving circuits can be reduced because the device can be operated at a low driving voltage of from several volts to several ten volts. Accordingly, it is expected to advantageously use the EL device in various applications such as flat-type display devices, illumination devices, backlight devices and others. Furthermore, the EL device is characterized by a variation of colors of the emitted light.

Specifically, the specific characteristics such as high viewing angle, high contrast and low temperature operability of the organic EL device are desirably useful in the application of the device to in-vehicle display devices. However, hitherto, it was very difficult to practice the application of the organic EL device in the production of the in-vehicle display devices, because the EL device has to satisfy the highly increased standards of the qualities for the in-vehicle devices, and also it suffers from the inherent problems due to use of the organic EL materials such as reduction of the luminescence and low heat resistance.

To improve the luminescence durability of the organic EL device, Japanese Unexamined Patent Publication (Kokai) No. 8-48656 teaches formation of the light-emitting layer of the EL device from a mixture of the hole-transporting material and the electron-transporting material as a host material with the light-emitting additive material as a dopant. However, the inventors of this application have found as a result of the study and examination of the proposed EL devices that some of the hole-transporting materials as the host material have a poor heat resistance and thus, if the EL device is used under the conditions of an increased temperature such as 100° C., dark spots and related drawbacks can be remarkably caused in the EL device, thereby resulting in a reduction of the luminescence in the device.

On the other hand, as is disclosed in Japanese Unexamined Patent Publication (Kokai) No. 2000-156290 and Gazette of International Patent Publication WO98/8360, there have been suggested to use a variety of hole-injecting and hole-transporting materials as a host material of the light-emitting layer in the organic EL device. The hole-injecting and hole-transporting materials disclosed therein include the materials having an increased glass transition temperature, thereby enabling to show a good durability at the elevated temperature. Specifically, there have been suggested the specific material containing at least three triphenylamines in a molecule thereof to thereby increase a glass transition temperature of the material to 100° C. or more. However, as a result of the study and examination of the proposed EL devices, the inventors of this application have found that a luminescence durability of the devices cannot be improved as a result of use of such specific material containing triphenylamines, though the generation of dark spots can be inhibited.

SUMMARY OF THE INVENTION

The present invention is directed to solve the prior art problems described above in the organic electroluminescent (EL) device, and an object of the present invention is to simultaneously satisfy an improved luminescence durability and an excellent heat resistance, i.e., resistance to the temperature of 100° C. or more, in an organic EL device comprising a light-emitting layer between a pair of electrodes, the light-emitting layer comprising, in combination, a hole-transporting material, an electron-transporting material and a light-emitting additive material.

This and other objects of the present invention will be easily understood from the following detailed description of the preferred embodiments of the present invention.

To accomplish the objects described above, the inventors of the present invention have conducted intensive studies, and have aimed at the constitution of the light-emitting layer, produced by mixing a hole-transporting material, an electron-transporting material and a light-emitting additive material, in the organic EL device.

First, the inventors have found that if the light-emitting layer is formed by mixing a hole-transporting material, an electron-transporting material and a light-emitting additive material, that is, the light-emitting layer is formed from a mixed host, a luminescence durability of the organic EL device can be improved, as the two different functions, i.e., the hole-transporting function and the electron-transporting function, can be independently, but simultaneously, attained in the same light-emitting layer as a result of shearing of the functions.

Second, they have found with regard to the reduction of the luminescence durability under the high temperature environments that such reduction can be induced depending upon the combination of the hole-transporting material and the electron-transporting material as the host in the light-emitting layer, because some combination can easily induce excitation of the electron-transporting material. They have also found that the excitation of the electron-transporting material can be caused due to transportation of holes from the hole-transporting material to the electron-transporting material.

In this connection, reference should be made to FIG. 1 which is a schematic view showing mechanism in the hole transportation between the hole-transporting material and the electron-transporting material in the light-emitting layer. The hole transportation is related to an energy gap between the hole-transporting material Ha and the electron-transporting material Hb, and the energy gap is defined as a difference of the ionization potential $\Delta G1$ between the materials Ha and Hb.

It is generally recognized in the light-emitting layer comprising the mixed host that holes are transported from one molecule to another molecule in the hole-transporting materials. In this hole transportation process, a hole-transporting molecule in the neutral condition is oxidized upon receipt of holes, and then transfers its holes to a counterpart hole-transporting molecule, thereby being oxidized to again become a neutral condition.

However, some hole-transporting material may have two or more oxidization states. The presence of such multiple oxidation states can be easily determined as multiple, i.e., two or more oxidation potentials in the hole-transporting material by using a cyclic voltammetry. In these multiple oxidation potentials, generally, the lowest oxidation potential is called "first oxidation potential", the second lower potential is called "second oxidation potential, the third lower potential is called "third oxidation potential", respectively, and so on. Generally, the first oxidation potential is defined as an ionization potential of the hole-transporting material.

It is noted in a series of the oxidation potentials that an energy gap ΔG1 between the hole-transporting material Ha and the electron-transporting material Hb is essentially a difference between the ionization potential of the hole-transporting material, i.e., first oxidization potential thereof, and the ionization potential of the electron-transporting material, i.e., first oxidation potential thereof, and therefore it is considered that the transfer of holes from the hole-transporting material Ha to the electron-transporting material Hb can be inhibited if the gap ΔG1 determined from a difference between the ionization potentials of the materials Ha and Hb is increased However, assuming that the first oxidation potential E1 is close to the second oxidation potential E2 in the hole-transporting material Ha, holes can be transferred from the first oxidation potential E1 to the second oxidation potential E2 in the hole-transporting material Ha. That is, a high level of the oxidation potentials in the hole-transporting material Ha can also contribute to the transportation of holes in the light-emitting layer.

Under the above conditions, an effective energy gap ΔG1 between the hole-transporting material Ha and the electron-transporting material Hb is reduced to a value of ΔG2. As a result of the reduction of the energy gap, it becomes possible to easily induce a transfer of holes from the hole-transporting material Ha to the electron-transporting material Hb.

Accordingly, in spite of the desire that holes are transferred between the molecules of the hole-transporting material Ha, holes can be transferred from the hole-transporting material Ha to the electron-transporting material Hb in the light-emitting layer, and thus holes can be again bonded with electrons in the electron-transporting material Hb. Thus, it is considered that the electron-transporting material Hb is excited with deterioration, resulting in a reduction of the luminescence durability.

The inventors have found from the presumed mechanism of the hole transportation described above with reference to FIG. 1, that if a potential difference between the first oxidation potential and the second oxidation potential of the hole-transporting material in the mixed host constituting the light-emitting layer is increased on some level, it becomes possible to sufficiently ensure an energy gap capable of concerning the hole transfer between the hole-transporting material and the electron-transporting material, thereby inhibiting a transfer of the holes between these materials.

Moreover, based on the above findings, the inventors have aimed at use of a tertiary amine compound as a hole-transporting material in the mixed host of the light-emitting layer, followed by experiments and studies concerning use of the tertiary amine compound.

As a result, the inventors have found that a luminescence durability of the organic EL device can be improved in comparison with the prior art EL devices using the conventional mixed host in the light-emitting layer, if the tertiary amine compound used as the hole-transporting material has two or more oxidation potentials, i.e., plural oxidation potentials, when they are determined by a cyclic voltammetry, and a potential difference between the first oxidation potential and the second oxidation potential in these plural oxidation potentials is at least a certain value or more.

That is, in the first aspect thereof, the present invention provides an organic electroluminescent (EL) device comprising a light-emitting layer between a pair of electrodes, the light-emitting layer comprising a mixture of a hole-transporting material consisting of a tertiary amine compound, an electron-transporting material and a light-emitting additive material, characterized in that:

the tertiary amine compound has plural, namely, two or more oxidation potentials determined by a cyclic voltammetry, a potential difference between the first oxidation potential and the second oxidation potential in the plural oxidation potentials is a value of 0.22V or more, and the tertiary amine compound has a glass transition temperature of at least 100° C., and the electron-transporting material has a glass transition temperature of at least 100° C.

According to the present invention, since each of the hole-transporting material and the electron-transporting material in the light-emitting layer has a glass transition temperature of at least 100° C., it becomes possible to ensure a heat resistance at the high temperature of 100° C. or more.

Further, as described above, the inventors of this application have found, through their experimental studies, the adjustment of the potential difference between the first and second oxidation potentials to a value of at least 0.22V (see, Table 1 described hereinafter).

As a result of the selection of the specific potential difference described above, according to the present invention, the hole transfer from the first oxidation potential to the second oxidation potential in the hole-transporting material can be inhibited, and thus the hole transfer to the electron-transporting material can be inhibited with prevention in the deterioration of the electron-transporting material. In practice, it could be conformed that a luminescence durability of the EL device can be improved according to the present invention.

As described above, according to the present invention, the luminescence durability can be improved and at the same time, the heat resistance at 100° C. or more can be ensured in the organic EL device comprising a pair of electrodes and a light-emitting layer sandwiched between the electrodes in which the light-emitting layer is constituted from a mixture of a tertiary amine compound, an electron-transporting material and a light-emitting additive material.

In a preferred embodiment of the present invention, the tertiary amine compound used as hole-transporting material in the formation of the light-emitting layer comprises four triphenylamines in a molecule thereof.

By introducing four triphenylamines to a molecule of the tertiary amine compound, it becomes possible to suitably realize the tertiary amine compound for use in the practice of the present invention, along with increase in the freedom in the molecule design of the hole-transporting material.

In this connection, it should be noted that if the tertiary amine compound used contains only at least two triphenylamines, only a limited number of the hole-transporting material is available in the practice of the present invention, because the functional groups capable of being introduced as the terminal group to the compound are largely restricted in view of necessity of ensuring the glass transition temperature of 100° C. or more.

Further, it is preferred in the tertiary amine compound that a phenyl group of triphenylamines contained in the amine compound does not contain a substituent in an ortho position of the phenyl group.

According to the present invention, the light-emitting layer can be preferably formed by co-depositing three components or materials, i.e., a tertiary amine compound, an electron-transporting material and a light-emitting additive material, and in the co-deposition process, the heating temperature for deposition is selected depending on the properties and the like of the materials used. The inventors have found with regard to the tertiary amine compound used as the hole-transporting material that if the tertiary amine compound used has a substituent in an ortho position of the phenyl group of triphenylamines thereof, it becomes difficult to select the suitable deposition conditions because the substituent of such amine compound is generally liable to be thermally decomposed during the deposition process.

However, when the tertiary amine compound has no substituent in an ortho position of the phenyl group as is suggested in the present invention, since the amine compound is generally resistive to thermal decomposition and thus the temperature can be easily controlled during the deposition process, it becomes possible to realize the stable deposition of the light-emitting layer.

Alternatively, it is preferred in the tertiary amine compound that a phenyl group of triphenylamines in the tertiary amine compound has a substituent in an ortho position thereof, and also the tertiary amine compound has a molecular weight of less than 1,100.

As a result of the studies, the inventors have found through their experiments that some of the tertiary amine compounds can be advantageously used in the practice of the present invention, with stable deposition of the light-emitting layer and without suffering from adverse effects of thermal decomposition, even if a phenyl group of triphenylamines has a substituent in an ortho position thereof, with the proviso that he tertiary amine compound has a molecular weight of less than 1,100.

Furthermore, when the light-emitting layer is formed using a mixed host, a luminescence durability of the resulting EL device can be improved in comparison with that of the corresponding EL devices having a light-emitting layer formed from a single host. However, depending on the combination of the materials used as the mixed host, some of the EL devices may result in a reduction of the emission efficiency. To solve this problem concerning the reduced emission efficiency, the present inventors have studied and found through their experiments that there is a correlation between the emission efficiency and the ionization potential of the tertiary amine compound in the light-emitting layer formed from a mixed host.

That is, according to another embodiment of the present invention, it is preferred in the tertiary amine compound made of a mixed host that the tertiary amine compound has an ionization potential of at least 5.45 eV. According to the present invention, when the light-emitting layer is formed using a mixed host, use of the tertiary amine compound having an ionization potential of at least 5.45 eV ensures satisfactory emission efficiency.

Moreover, in another embodiment of the present invention, it is preferred that the tertiary amine compound, when its oxidation-reduction curve is determined by a cyclic voltammetry, shows a profile of the curve in an oxidation side which is symmetric to a profile of the curve in a reduction side.

As described above, the hole-transporting material in a neutral condition is oxidized upon receipt of holes, and then the oxidized material transfers its holes to the counterpart hole-transporting material, while the material itself is reduced to again show a neutral condition.

In this hole-transporting material, if a profile of the oxidation side and a profile of the reduction side are symmetric in the oxidation-reduction curve determined by a cyclic voltammetry as is suggested in the present invention, the hole-transporting material can easily reproduce its original hole-transporting function, after transfer of holes to another hole-transporting material.

Contrary to this, when a profile of the oxidation side and a profile of the reduction side are asymmetric in the oxidation-reduction curve, the hole-transporting function can be hardly reproduced in the hole-transporting material after transfer of holes, and thus the hole-transporting capability is lowered in the hole-transporting material. As a result, a resistance of the hole-transporting material in the light-emitting layer increased and a distribution of the emission spectrum is shifted. Thus, the emission efficiency and the luminescence durability are lowered. In view of removing these drawbacks and more effectively inhibiting the deterioration of the luminescence durability, the present invention is considered to be desirable and useful.

In another embodiment of the present invention, it is preferred in the light-emitting layer of the organic EL device that the electron-transporting material shows a difference in the ionization potential between the electron-transporting material and the hole-transporting material of at least 0.35 eV.

The inventors have found this preferred embodiment thorough their experimental studies, and preferably, the luminescence durability can be improved by adjusting the ionization potential between the electron-transporting material and the hole-transporting material to a value of 0.35 eV or more.

In the second aspect thereof, the present invention provides a process for the production of an organic EL device comprising a light-emitting layer between a pair of electrodes, the light-emitting layer comprising a mixture of a hole-transporting material consisting of a tertiary amine compound, an electron-transporting material and a light-emitting additive material. The production process of the EL device according to the present invention is characterized in that:

the tertiary amine compound comprises four triphenylamines in a molecule thereof and has a glass transition temperature of at least 100° C., the electron-transporting material shows a difference in the ionization potential between the electron-transporting material and the hole-transporting material of 0.35 eV or more and has a glass transition temperature of at least 100° C., and in the formation of the light-emitting layer, the conditions applied for the formation of the layer from the electron-transporting material are controlled in such a manner that in the resulting thin layer of the electron-transporting material, when a peak of the fluorescence spectrum of the thin layer is observed at a position which is 20 nm or more larger than the build-up value of the same spectrum, a peak or shoulder of the spectrum is created at a position which is less than 20 nm from the build-up value.

The inventors of this application have found this production process of the present invention through their experimental studies, and unexpectedly, when the specific hole-transporting material and the specific electron-transporting material are used in the formation of the light-emitting layer, and at the same time, the deposition conditions of the electron-transporting material are controlled in the manner described above and explained hereinafter, it becomes possible to produce an organic EL device capable of simultaneously satisfying two requirements, i.e., improvement in the luminescence durability and the establishment in a heat resistance at 100° C. or more.

In the production process of the present invention, it is preferred that the deposition conditions for forming a layer of the electron-transporting material are controlled by controlling a heating temperature of the electron-transporting material.

Further, it is preferred that the tertiary amine compound used herein is a compound represented by the following formula (I):

urated chain-like hydrocarbon group or an unsaturated cyclic hydrocarbon group, and $R_2$, $R_3$, $R_4$, and $R_5$ independently represent a hydrogen atom, an alkyl group or an aryl group.

Furthermore, it is preferred in the production process that the tertiary amine compound has an ionization potential of at least 5.45 eV.

As in the EL device described above, when the amine compound used in the production process of the present invention has an ionization potential of at least 5.45 eV, it is effective to establish the satisfactory emission efficiency.

Furthermore, it is preferred in the production process that the tertiary amine compound, when its oxidation-reduction curve is determined by a cyclic voltammetry, shows a profile of the curve in an oxidation side which is symmetric to a profile of the curve in a reduction side.

As in the EL device described above, in the production process of the present invention, since the hole-transporting material used herein can easily reproduce its original hole-

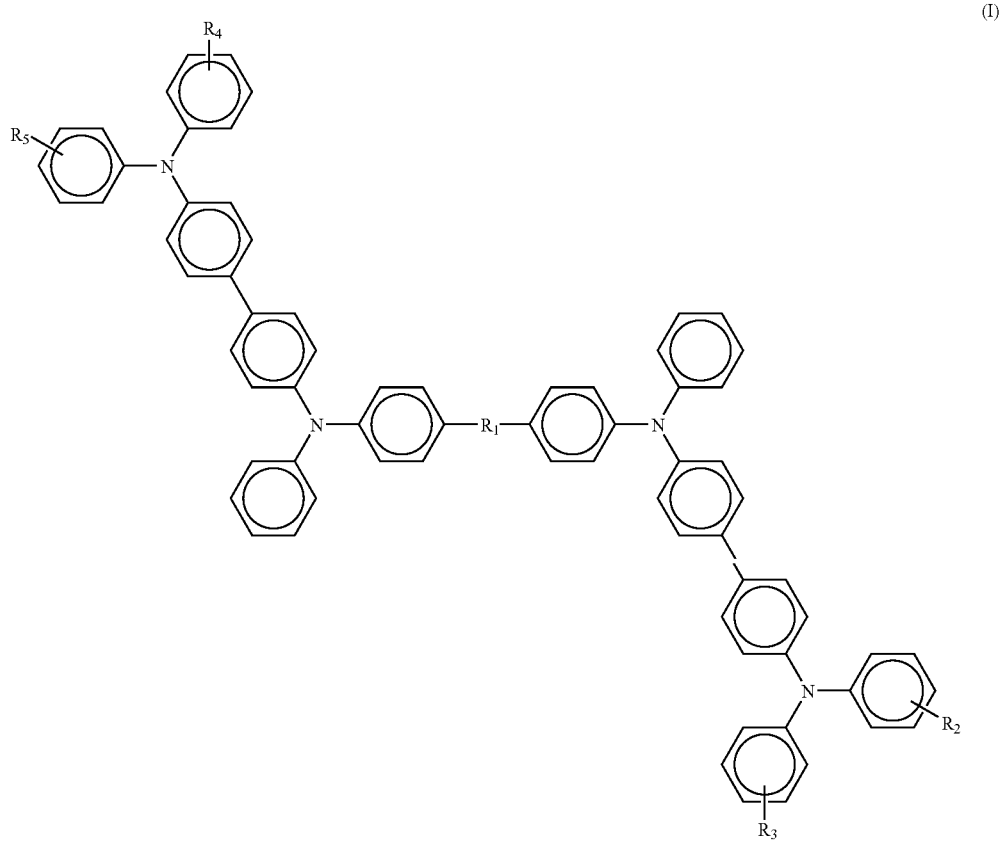

(I)

in which $R_1$ is a group represented by the following formula (II):

(II)

wherein n is an integer of at least 0 inclusive of 0, $L_1$ is a member selected from the group consisting of a saturated chain-like hydrocarbon group, a saturated cyclic hydrocarbon group, a saturated polycyclic hydrocarbon group and fluorene, and $L_2$ and $L_3$ independently represent an unsattransporting function after transfer of holes, it becomes possible to more effectively inhibit a reduction of the luminescence durability.

Moreover, as a result of studies of the tertiary amine compound used as a hole-transporting material in the formation of the mixed host-based light-emitting layer, the inventors have found through their experiments that the tertiary amine compound having the predetermined molecular structure is effective to attain the object of the present invention.

That is, according to the third aspect thereof, the present invention provides an organic EL device comprising a light-emitting layer between a pair of electrodes, the light-emitting layer comprising a mixture of a hole-transporting material consisting of a tertiary amine compound, an electron-transporting material and a light-emitting additive material. The organic EL device of the present invention is characterized in that:

the electron-transporting material has a glass transition temperature of at least 100° C., and the tertiary amine compound used as the hole-transporting material is a compound represented by the following formula (III):

wherein $l$, $m_1$, $m_2$, $n_1$ and $n_2$ each is an integer of at least 1, x is an integer of at least 1, y is 0 or an integer of at least 1, and $L_1$ and $L_2$ independently represent an acene compound group, and $R_2$, $R_3$, $R_4$ and $R_5$ independently represent a hydrogen atom, an alkyl group or an aryl group.

In the tertiary amine compound represented by the above formula (III), there are plural oxidation potentials determined by a cyclic voltammetry, a potential difference in the first and second oxidation potentials in the observed plural oxidation potentials is at least 0.22V. Further, the tertiary amine compound has a glass transition temperature of at

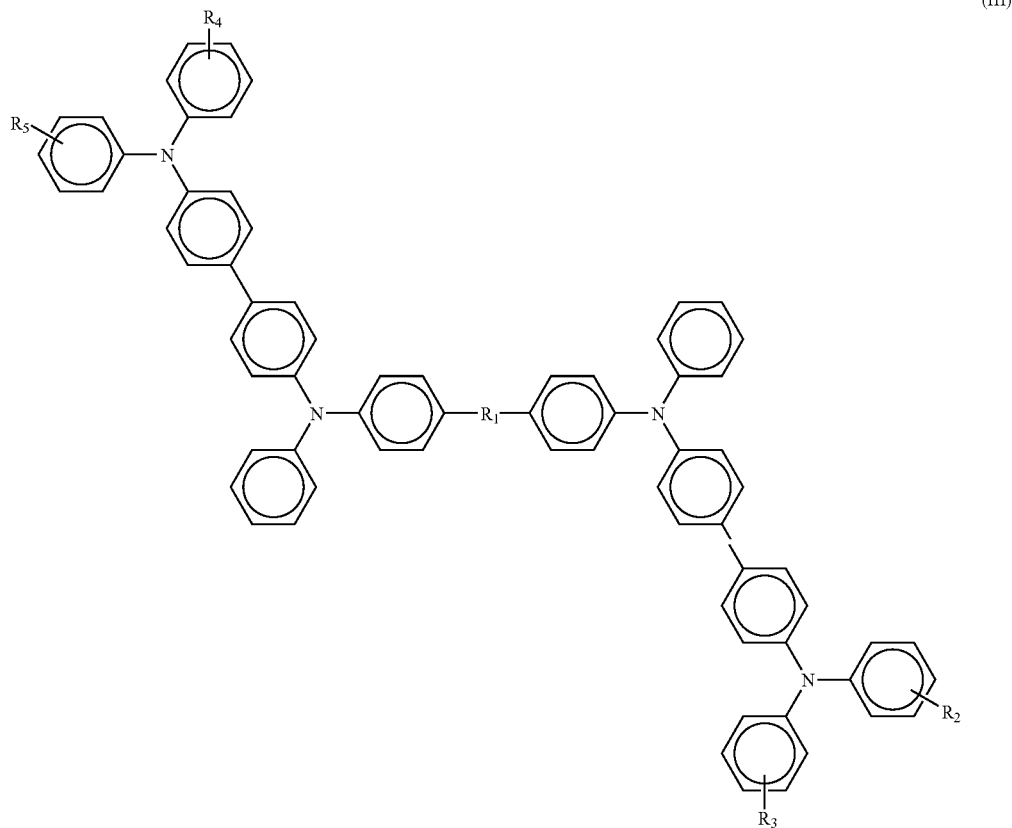

(III)

in which $R_1$ is a group represented by the following formula (IV) or (V):

(IV)

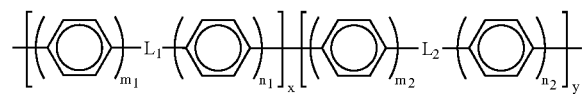

(V)

least 100° C. Furthermore, the electron-transporting material used in the EL device has a glass transition temperature of at least 100° C.

Using these materials, as both of the hole-transporting material and the electron-transporting material in the light-emitting layer have a glass transition temperature of 100° C. or more, a heat resistance at 100° C. or more can be secured.

Further, as a result of application of the above-described specific differential potential to the tertiary amine compound, the transfer of holes from the first is oxidation potential to the second oxidation potential in the hole-transporting material can be inhibited, and thus the hole transfer to the electron-transporting material can be inhibited while inhibiting the deterioration of the electron-transporting material. In practice, it could be conformed that a luminescence durability of the EL device was improved using this tertiary amine compound.

As is appreciated from the above, according to the present invention, an improvement in the luminescence durability and an establishment of the heat resistance at 100° C. or more can be simultaneously accomplished in the organic EL device comprising a light-emitting layer, formed from a mixture of a tertiary amine compound, an electron-transporting material and a light-emitting additive material, between a pair of electrodes.

In particular, to obtain the suitably generated functions of the present invention, it is preferred that the tertiary amine compound represented by the above formula (III) is a compound represented by the following formula (VI):

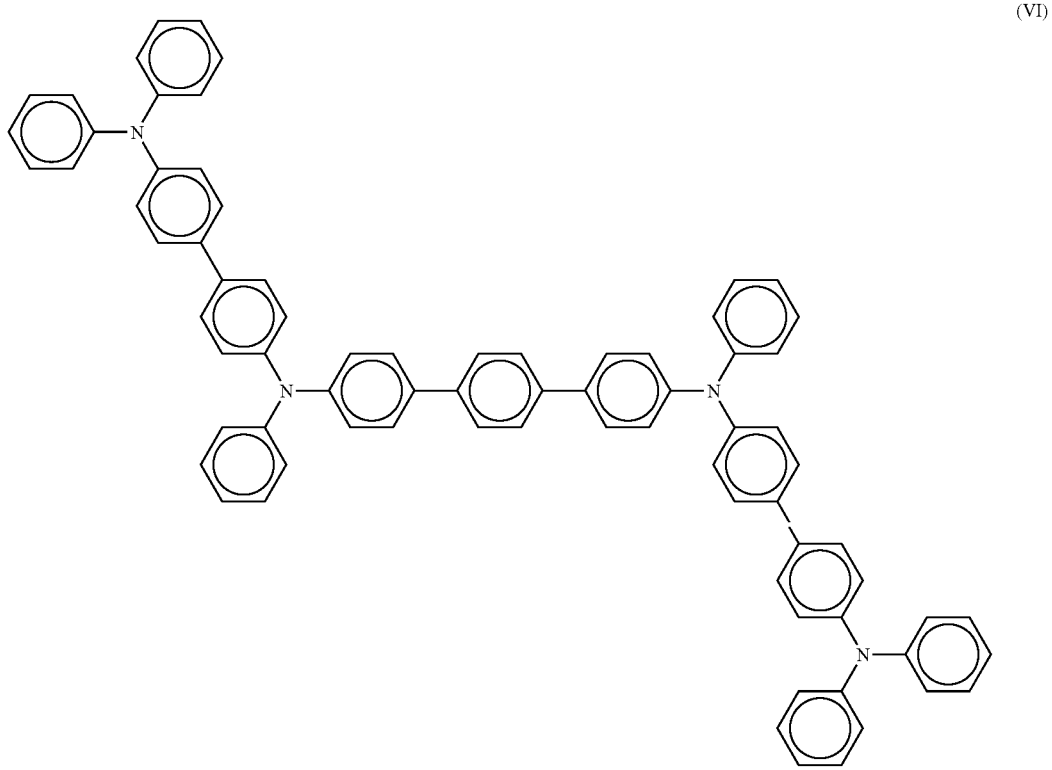

(VI)

In addition, in the organic EL device of the present invention, it is preferred that the light-emitting layer is produced as a laminated structure comprising two or more layers containing the hole-transporting material (tertiary amine compound), the electron-transporting material and the light-emitting additive material in different mixing ratios, and in this laminated structure, the mixing ratio of the hole-transporting material is controlled so that a mixing ratio of the hole-transporting material in a side of the anode in the pair of the electrodes is larger than that in a side of the cathode in the electrodes. It could be confirmed that the luminescence durability was improved as a result of the application of this laminated structure.

Further, in this organic EL device, if different light-emitting additive materials, i.e., light-emitting additive dyes, are used and they are selectively added to each of the light-emitting layer, it becomes possible to emit a light in a mixture of colors such as white light in the EL device.

Furthermore, when the light-emitting layer has the laminated structure as described above, and two or more light-emitting layer each contains different light-emitting additive dyes, it could be confirmed that if a blue light-emitting layer containing a blue light-emitting additive dye is contained in the light-emitting layers in such a manner that the blue light-emitting layer is disposed in a cathode side of the electrodes, and another light-emitting layer capable of emitting a light having a longer wavelength than that of the blue light is disposed in an anode side of the electrodes, a luminescence durability of the device can be improved.

DESCRIPTION OF THE PREFERRED EMBODIMENTS

The present invention will be further described with regard to the embodiments thereof referring to the accompanying drawings.

First Embodiment

Figure 1:
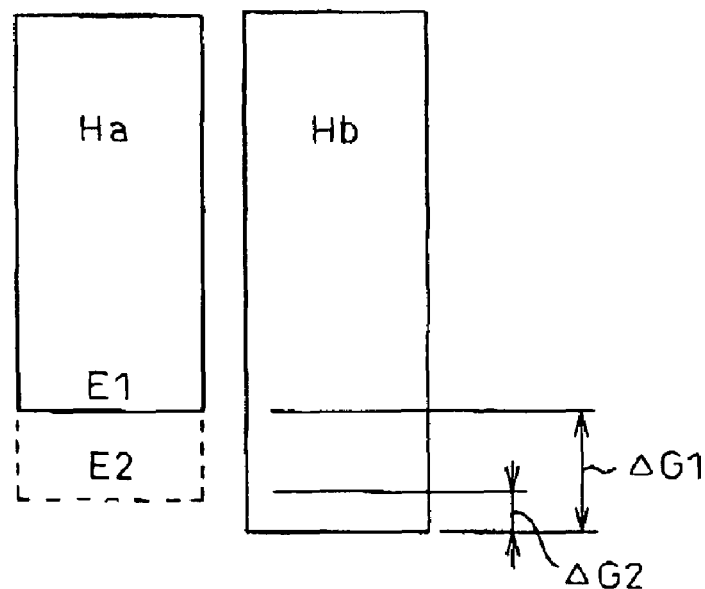
FIG. 1 is a schematic view showing mechanism in the hole transportation between the hole-transporting material and the electron-transporting material in the mixed host of the light-emitting layer.

FIG. 1 schematically illustrates a cross-sectional structure of the organic electroluminescent (EL) device S1 according to one embodiment of the present invention. The EL device S1 comprises a substrate 10 such as glass and the like and an anode 20 applied on the substrate 10. The anode 20 consists of a transparent conductive coating such as indium-tin oxide (ITO) and the like. A hole-injecting layer 30 is formed over the anode 20. The hole-injecting layer 30 comprises a hole-injecting material such as copper phthalocyanine (hereinafter, CuPc) which is an organic material having a crystallinity. Further, a hole-transporting layer 40 comprising a hole-transporting material such as a tertiary amine compound and the like is formed over the hole-injecting layer 30.

In the illustrated EL device, when the anode 20 is constituted from an ITO coating, it is preferred that the ITO coating has an average surface roughness Ra of not more than 2 nm, and a 10-point average surface roughness Rz of not more than 20 nm. Note that the determination of the surface roughness Ra and Rz is described in Japanese Industrial Standard (JIS).

In the formation of the hole-injecting layer 30 over the anode 20, the surface roughness of the anode 20 is an important factor for the purpose of forming the hole-injecting layer 30 from the crystalline organic material as a stable layer having a high crystallinity. As a result of their studies, the inventors of this application have found that preferably the ITO coating should be formed at an average surface roughness Ra of not more than 2 nm, and a 10-point average surface roughness Rz of not more than 20 nm.

Further, a light-emitting layer 50 is formed over the hole-transporting layer 40. The light-emitting layer 50 is constituted from a mixture of a hole-transporting material consisting of a tertiary amine compound and a electron-transporting material as a host material and a light-emitting additive material as a dopant.

Furthermore, an electron-transporting layer 60 consisting of an electron-transporting material such as tris(8-hydroxyquinolinato)aluminum (hereinafter, Alq3) and the like is formed over the light-emitting layer 50. An electron-injecting layer 70 consisting of lithium fluoride (LiF) and the like is formed over the electron-transporting layer 60, and a cathode 80 consisting of a metal such as Al and the like is formed over the electron-injecting layer 70.

Thus, as illustrated, an organic El device S1 comprising a pair of electrodes 20 and 80 having sandwiched therebetween a laminate, stacked in sequence, of the hole-injecting layer 30, the hole-transporting layer 40, the light-emitting layer 50, the electron-transporting layer 60 and the electron-injecting layer 70 is produced.

In this organic EL device S1, an electric field is applied to between the anode 20 and the cathode 80 to inject and transport both of holes from the anode 20 and the electrons from the cathode 80 to the light-emitting layer 50. Light emission is induced by the energy generated through the re-bonding of the electrons and the holes in the light-emitting layer 50. The light emission is visible, for example, through a side of the substrate 10, because light is emitted from the transparent substrate 10.

The organic EL device S1 can be produced by depositing over the substrate 10, in sequence, the layers 20, 30, 40, 50, 60, 70 and 80 using a conventional thin layer formation method such as sputtering, vapor deposition and the like. Here, organic layers such as the hole-injecting layer 30, the hole-transporting layer 40, the light-emitting layer 50 and the electron-transporting layer 60 are preferably formed with a vapor deposition method.

In the illustrated embodiment of the EL device S1, the light-emitting layer 50 is constituted from a mixture of a hole-transporting material consisting of a tertiary amine compound, a electron-transporting material and a light-emitting additive material. Among these materials, both of the tertiary amine compound and the electron-transporting material are those having a glass transition temperature of at least 100° C. for the purpose of ensuring a heat resistance of at least 100° C.

Further, for the purpose of improving a luminescence durability of the EL device S1, the tertiary amine compound used as the hole-transporting material in the light-emitting layer 50 is those having plural oxidation potentials, determined by a cyclic voltammetric method, wherein a potential difference between the first oxidation potential and the second oxidation potential in the oxidation potentials is 0.22V or more. Hereinafter, the potential difference between the first oxidation potential and the second oxidation potential is called "oxidation potential difference".

As the tertiary amine compound as the hole-transporting material satisfying the above-described requirements for the glass transition temperature and the oxidation potential difference, used preferably is a tertiary amine compound having four triphenylamines in a molecule thereof.

Further, among the tertiary amine compounds having the satisfactory glass transition temperature and oxidation potential difference, to inhibit the undesired thermal decomposition caused upon heating of the layer-forming materials during formation of the light-emitting layer 59, used preferably is a tertiary amine compound in which no substituent is contained in an ortho position of the phenyl group of triphenylamines thereof.

Alternatively, as the tertiary amine compound having the satisfactory glass transition temperature and oxidation potential difference, used also is a tertiary amine compound in which a phenyl group of triphenylamines has a substituent in an ortho position of the phenyl group, and the tertiary amine compound has a molecular weight of less than 1,100.

Furthermore, when the light-emitting layer 50 is formed from a mixed host, a luminescence durability of the EL device S1 can be improved in comparison with that of the corresponding EL devices having a light-emitting layer formed from a single host. However, some of the EL devices may result in a reduction of the emission efficiency depending on the combination of the materials constituting the mixed host. Thus, for the purpose of preventing a reduction of the emission efficiency, used preferably is a tertiary amine compound having an ionization potential of at least 5.45 eV.

Furthermore, for the purpose of more effectively inhibiting a reduction of the luminescence durability, used preferably is a tertiary amine compound in which, when its oxidation-reduction curve is determined by a cyclic voltammetric method, a profile of the curve in an oxidation side and a profile of the curve in a reduction side are symmetric.

Moreover, in the light-emitting layer 50 according to the illustrated embodiment of the present invention, for the purpose of improving a luminescence durability, used preferably is an electron-transporting material having a difference in the ionization potential between the electron-transporting material and the hole-transporting material of at least 0.35 eV.

In addition, in the light-emitting layer 50 of the illustrated embodiment, even if the tertiary amine compound used as the hole-transporting material does not satisfy the above-described requirement concerning the oxidation potential difference, it becomes possible to simultaneously attain the improvement in the luminescence durability and the establishment in a heat resistance at 100° C. or more when the present EL device is produced in accordance with the specific production method described hereinafter.

The specific production method is directed to the formation of a light-emitting layer 50 in the production process of the organic EL device S1, and is characterized in that used is a tertiary amine compound comprising four triphenylamines in a molecule thereof and at the same time having a glass transition temperature of at least 100° C.

Further, in the specific production process, used is an electron-transporting material showing a difference in the ionization potential between the electron-transporting material and the hole-transporting material of 0.35 eV or more and at the same time having a glass transition temperature of at least 100° C.

Furthermore, in the formation of the light-emitting layer 50 in the specific production process, the conditions for forming a thin layer from the electron-transporting material are preferably controlled in such a manner that when a peak of the fluorescence spectrum of the resulting thin layer is observed at a position which is 20 nm or more larger than the build-up value of the same spectrum, a peak or shoulder of the spectrum is created at a position which is less than 20 nm from the build-up value in the thin layer of the electron-transporting material. As a result of application of the such controlled layer-formation conditions, it becomes possible to simultaneously attain the improvement in the luminescence durability and the establishment in a heat resistance at 100° C. or more.

Specifically, the layer-formation of the electron-transporting material in the formation of the light-emitting layer 50 can be advantageously carried out by controlling a heating temperature of the electron-transporting material used.

That is, the light-emitting layer 50 is produced upon co-deposition of three source materials, i.e., hole-transporting material, electron-transporting material and light-emitting additive material while heating each material at the predetermined heating temperature, and in this co-deposition process, according to the present invention, the heating temperature of the electron-transporting material is varied depending upon the above manner.

As a result of application of the varied heating temperature to the electron-transporting material, when the electron-transporting material is deposited as a thin layer, it becomes possible to generate a peak or shoulder of the fluorescence spectrum at a position which is less than 20 nm from the build-up value in the thin layer of the electron-transporting material, even if the electron-transporting material used, when formed as a thin layer, generally shows a peak of the fluorescence spectrum at a position which is 20 nm or more larger than the build-up value of the spectrum.

Furthermore, in the formation of the light-emitting layer 50 in the specific production process, used preferably is a tertiary amine compound represented by the following formula (I):

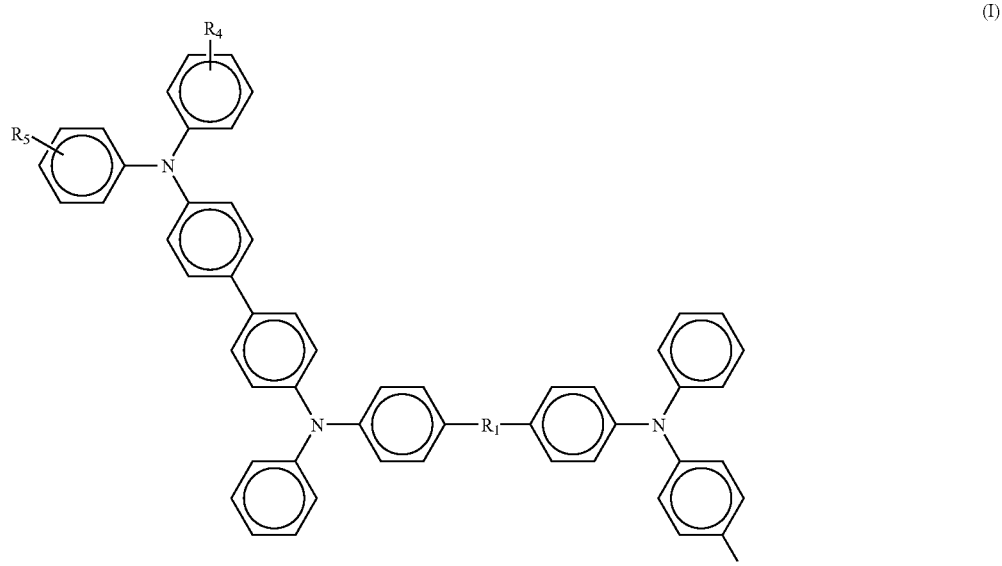

(I)

-continued

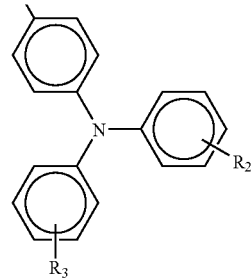

in which
R$_1$ is a group represented by the following formula (II):

 (II)

wherein n is an integer of at least 0 inclusive of 0, L$_1$ is a member selected from the group consisting of a saturated chain-like hydrocarbon group, a saturated cyclic hydrocarbon group, a saturated polycyclic hydrocarbon group and fluorene, and L$_2$ and L$_3$ independently represent an unsaturated chain-like hydrocarbon group or an unsaturated cyclic hydrocarbon group, and R$_2$, R$_3$, R$_4$ and R$_5$ independently represent a hydrogen atom, an alkyl group or an aryl group.

Typical examples of the tertiary amine compound (II) suitable for the practice of the present invention include Compounds 1 and 2 which will be described below, for example.

Also, in this specific production process, it is preferred that the tertiary amine compound used in the formation of the light-emitting layer 50 has an ionization potential of at least 5.45 eV. Further, it is preferred that the tertiary amine compound, when its oxidation-reduction curve is determined by a cyclic voltammetric method, shows a profile of the curve in an oxidation side which is symmetric to a profile of the curve in a reduction side.

Second Embodiment

The second embodiment of the present invention will be described hereinafter. Note in this section concerning the second embodiment that the differences between the first and second embodiments are particularly described to avoid the duplicated descriptions, because the second embodiment is similar to the first embodiment.

The organic EL device according to the second embodiment of the present invention has the structure similar to that of the EL device according to the first embodiment of the present invention described above with reference to FIG. 2. That is, as is illustrated, the EL device comprises a pair of electrodes 20 and 80 having sandwiched therebetween a laminated structure of a hole-injecting layer 30, a hole-transporting layer 40, a light-emitting layer 50, an electron-transporting layer 60 and an electron-injecting layer 70.

In the second embodiment of the present invention, it is characterized in that the specified tertiary amine compound having the molecule structure inherent to this embodiment is used in the formation of the light-emitting layer 50 from a mixture of a hole-transporting material consisting of a tertiary amine compound, an electron-transporting material and a light-emitting additive material.

That is, in the formation of the light-emitting layer 50 in according to the second embodiment, the electron-transporting material used is those having a glass transition temperature of at least 100° C., and the tertiary amine compound used as the hole-transporting material is those represented by the following formula (III):

(III)

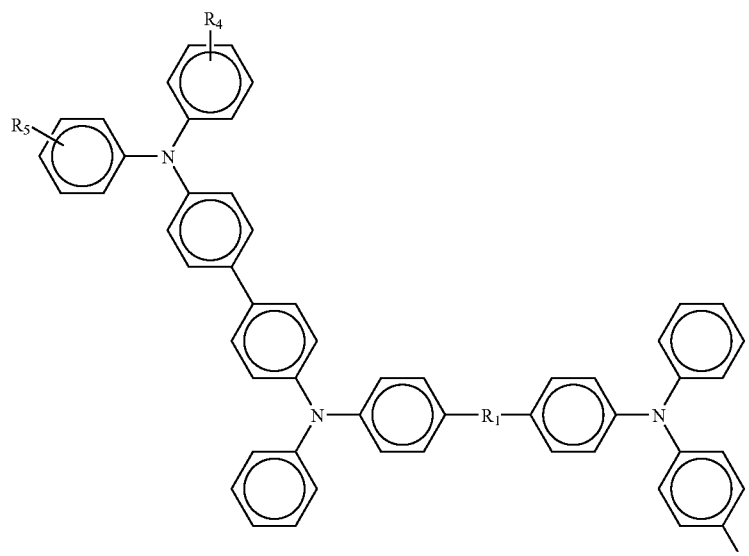

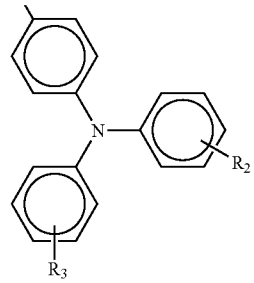

in which
R₁ is a group represented by the following formula (IV) or (V):

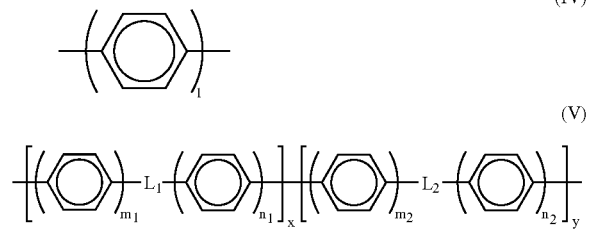

wherein $l$, $m_1$, $m_2$, $n_1$ and $n_2$ each is an integer of at least 1, x is an integer of at least 1, y is 0 or an integer of at least 1, and $L_1$ and $L_2$ independently represent an acene compound group, and $R_2$, $R_3$, $R_4$ and $R_5$ independently represent a hydrogen atom, an alkyl group or an aryl group.

The acene compound group introduced as the $L_1$ and $L_2$ groups includes the following groups containing the described molecule skeleton in which benzene rings are linearly bonded:

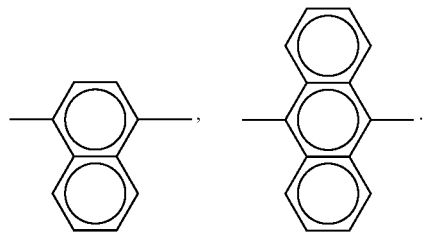

The tertiary amine compound represented by the above formula (III) has plural, i.e., two or more oxidation potentials determined by a cyclic voltammetric method wherein a potential difference between the first oxidation potential and the second oxidation potential in said oxidation potentials is 0.22V or more, and has a glass transition temperature of at least 100° C.

The effectiveness and usefulness of the tertiary amine compound (III) has been found by the inventors of this application as a result of their studies as follows:

As described above, the tertiary amine compound of the formula (I), for example, Compound 14 described in the following examples, is used as the typical tertiary amine compound in the practice of the first embodiment of the present invention. In the tertiary amine compound (I), the group R₁ having bonded to both sides thereof a benzene ring includes a saturated hydrocarbon group.

Contrary to tertiary amine compound (I), in the tertiary amine compound (III) used in the present embodiment, the group R₁ having bonded to both sides thereof a benzene ring does not include a saturated hydrocarbon group.

As will be described with reference to Compound 7 in the following examples, if triphenylamines are simply converted to the corresponding polymer as in Compound 7, it is considered that a close relation is generated between the first and second oxidation potentials as a function of the extension of the conjugation portion. Specifically, it is appreciated that Compound 7 corresponds to the structure of each of the above formulae (I) and (III) with the proviso that the group R₁ is not contained in the structure.

If the group R₁ is not contained in the structure as in Compound 7, it is considered that there may be easily caused a resonance reaction between the two benzene rings in a central portion of the structure, and thus the oxidation potential difference is reduced as a function of the resonance reaction.

Under these conditions, if a saturated hydrocarbon group is introduced between the two benzene rings in the central portion as in the tertiary amine compound (I) suggested in the above-described first embodiment of the present invention, it becomes possible to discontinue the resonance reaction between the benzene rings, thereby ensuring a relatively high oxidation potential difference in comparison to the corresponding compound having no saturated hydrocarbon group between the benzene rings.

Based on the above findings, the inventors have further studied, and unexpectedly, they have found that the discontinuation of the resonance reaction between the benzene rings will be similarly accomplished if a benzene-containing compound is introduced between the central benzene rings, in place of the saturated hydrocarbon group.

The inventors have prepared the tertiary amine compounds comprising a benzene ring-containing compound between the central benzene rings, i.e., the tertiary amine compound represented by the formula (III), and studied them with regard to use as the hole-transporting material in the formation of the light-emitting layer of the organic EL device. As a result, it was confirmed that using the tertiary amine compound (III), the satisfactory oxidation potential difference which is equivalent to or higher than that of the tertiary amine compound (I) could be realized.

More especially, as the tertiary amine compound (III), used is preferably a compound represented by the following formula (VI):

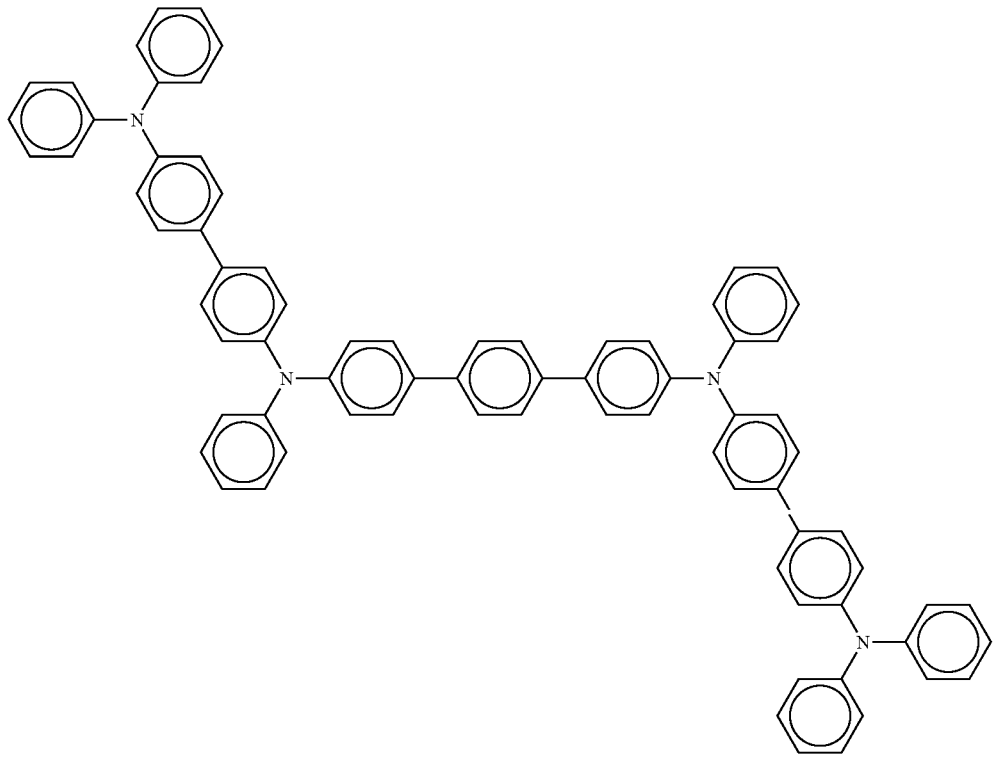

(VI)

The tertiary amine compound (VI) is N,N'-bis(4-diphenylaminobiphenyl-4'-yl)-N,N'-diphenyl-4,4'-diamino-p-terphenyl, and is also referred herein to as "Compound 12".

Referring to Compound 12 along with the above formula (III), it is appreciated that Compound 12 contains a single benzene ring as the group $R_1$ of the formula (III), and thus it contains three benzene rings connected in series in the central portion of the molecule. Note in the tertiary amine compound (III) inclusive of compound 12 that at least three benzene rings are connected in series in the central portion of the molecule.

In the tertiary amine compounds, if they have the specific structure containing at least three in-series-bonded benzene rings, it is considered that larger twisting between the benzene rings is generated in comparison with the compounds containing only two benzene rings, thereby inhibiting the generation of the above-described resonance reaction between the adjacent benzene rings.

That is, according to the second embodiment of the present invention, the light-emitting layer 50 is formed by using, as a mixed host, the tertiary amine compound (III) in combination with the electron-transporting material having a glass transition temperature of at least 100° C. such as those used in the first embodiment of the present invention, for example, Compounds 8 and 9 described in the following examples.

Using the mixed host described above, since both of the hole-transporting material and the electron-transporting material in the light-emitting layer 50 have a glass transition temperature of at least 100° C., a heat resistance at 100° C. or more can be ensured.

Moreover, it is also possible in this embodiment of the present invention to inhibit the hole transfer from the first oxidation potential to the second oxidation potential in the hole-transporting material because an oxidation potential difference of the tertiary amine compound can be controlled to at least 0.22V, thereby inhibiting the hole transfer to the electron-transporting material, and thus preventing the deterioration of the electron-transporting material. It was practically confirmed that the a luminescence durability of the EL device could be improved in the second embodiment of the present invention.

As is appreciated from the above description, according to the second embodiment of the present invention, both of the improvement of the luminescence durability and the establishment of the heat resistance at 100° C. or more can be simultaneously attained in the organic EL device which comprises a light-emitting layer 50 constituted from, in combination, a hole-transporting material, an electron-transporting material and a light-emitting additive material, between a pair of electrodes 20 and 80.

Further, since the tertiary amine compound (III) used as the hole-transporting material has an oxidation potential difference of at least 0.22V, it is not necessary to use the specific production process suggested in the first embodiment of the present invention in the production of the organic EL device. This is because, in the first invention of the present invention, the tertiary amine compound used may have an oxidation potential difference of less than 0.22V, and thus the specific production process is required as is described in the following examples (Examples 1-2,2-2 and 7-2, and Table 1).

That is, according to the second embodiment of the present invention, both of the improvement of the luminescence durability and the establishment of the heat resistance at 100° C. or more can be simultaneously attained in the organic EL device by using any conventional production processes well-known in the production of the EL devices.

In other words, the object of the present invention can be attained by not using the specific production process in which "the tertiary amine compound used comprises four triphenylamines in a molecule thereof and has a glass transition temperature of at least 100° C., the electron-transporting material used shows a difference in the ionization potential between the same and the hole-transporting material of 0.35 eV or more and has a glass transition temperature of at least 100° C., and in the formation of the light-emitting layer, the conditions applied for the formation of the layer from the electron-transporting material are controlled in such a manner that in the resulting thin layer of the electron-transporting material, when a peak of the fluorescence spectrum of the thin layer is observed at a position which is 20 nm or more larger than the build-up value of the same spectrum, a peak or shoulder of the spectrum is created at a position which is less than 20 nm from the build-up value."

Further, when the mixed host containing the tertiary amine compound (III) as the hole-transporting material is used in the formation of the light-emitting layer 50, a luminescence durability can be improved in comparison with use of the single host, along with prevention of the reduction of the emission efficiency. This is because the tertiary amine compound (III) has an ionization potential of at least 5.45 eV.

Furthermore, it is preferred in this embodiment that the tertiary amine compound (III), when its oxidation-reduction curve is determined by a cyclic voltammetric method, shows a symmetric profile in both of the oxidation side and the reduction side in the curve.

Moreover, as in the fist embodiment of the present invention, it is preferred in this embodiment that a difference in the ionization potential between the electron-transporting material and the hole-transporting material is at least 0.35 eV for the purpose of improving a luminescence durability.

Third Embodiment

The third embodiment of the present invention will be described hereinafter.

In the production of the organic EL device, it was confirmed that if the light-emitting layer 50 constituted from a mixture of the hole-transporting material, the electron-transporting material and the light-emitting additive material is produced as a laminated structure comprising two or more layers containing these materials, and in the production of the laminated structure, the materials are mixed in different mixing ratios in such a manner that a mixing ratio of the hole-transporting material in a side of the anode 20 is larger than that in a side of the cathode 80, a luminescence durability of the EL device could be improved.

In the third embodiment of the present invention, if different light-emitting additive materials, i.e., light-emitting additive dyes, are used and they are added to each of the light-emitting layer, a light in a mixture of colors such as white light can be emitted in the EL device.

Further, when the light-emitting layer 50 is constituted from the laminated structure as described above, and different light-emitting additive dyes are added to each of the plural light-emitting layers, it could be confirmed that if a blue light-emitting layer containing a blue light-emitting additive dye is contained in the light-emitting layers in such a manner that the blue light-emitting layer is disposed in a cathode side, and another light-emitting layer capable of emitting a light having a longer wavelength than that of the blue light is an anode side, a luminescence durability of the EL device can be improved.

EXAMPLES

The present invention will be further described with reference to the examples thereof. In particular, the constitution and others of the light-emitting layer in the organic EL device according to the present invention will be described in this section referring to the examples in which a variety of tertiary amine compounds and other compounds were studied for the practice of the present invention. Note, however, that the present invention should not be restricted to these examples.

Examples of First Embodiment

Figure 2:
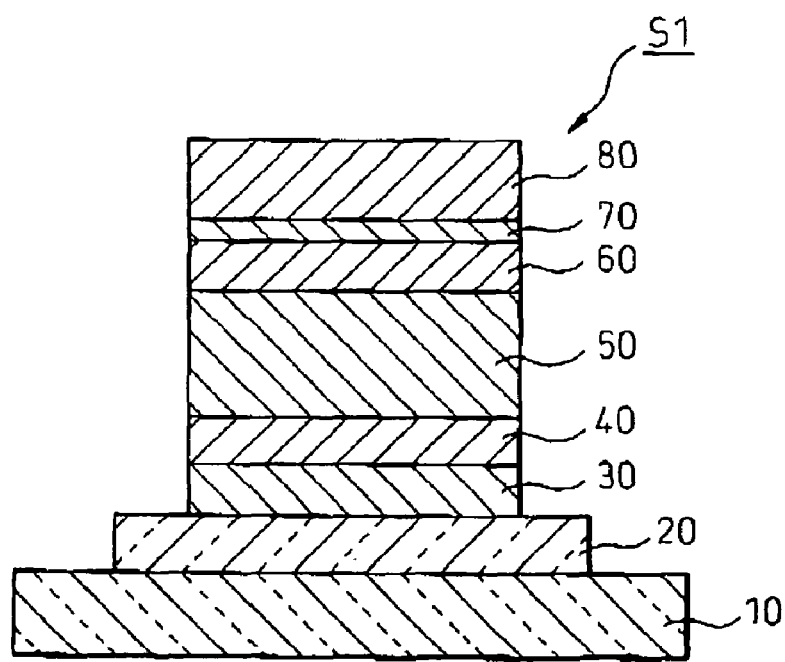
FIG. 2 is a cross-sectional view of the organic EL device according to the first embodiment of the present invention.

The organic EL device S1 illustrated in FIG. 2 was produced. In the formation of the light-emitting layer 50, Compounds 1 to 10, described below, were used, in which Compounds 1 to 7 each is a hole-transporting material, compounds 8 and 10 each is an electron-transporting material and Compound 9 is a light-emitting additive material (styrylamine derivative capable of emitting blue color light).

Compound 1

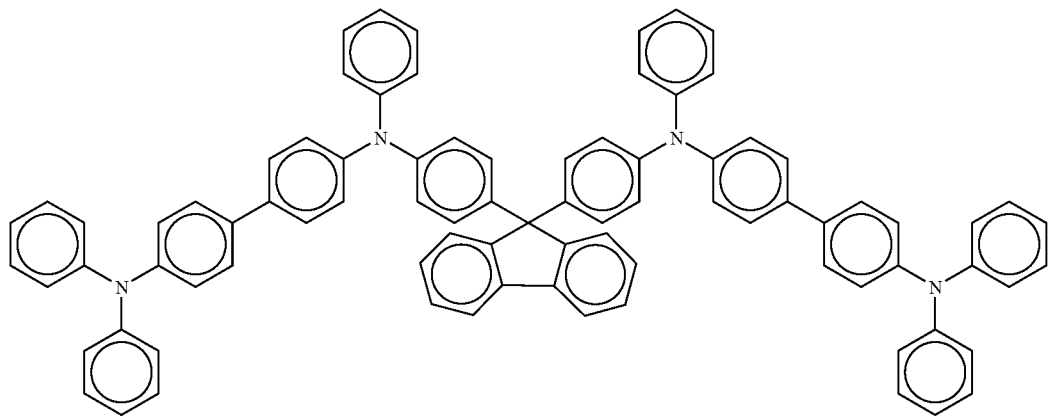

Compound 2
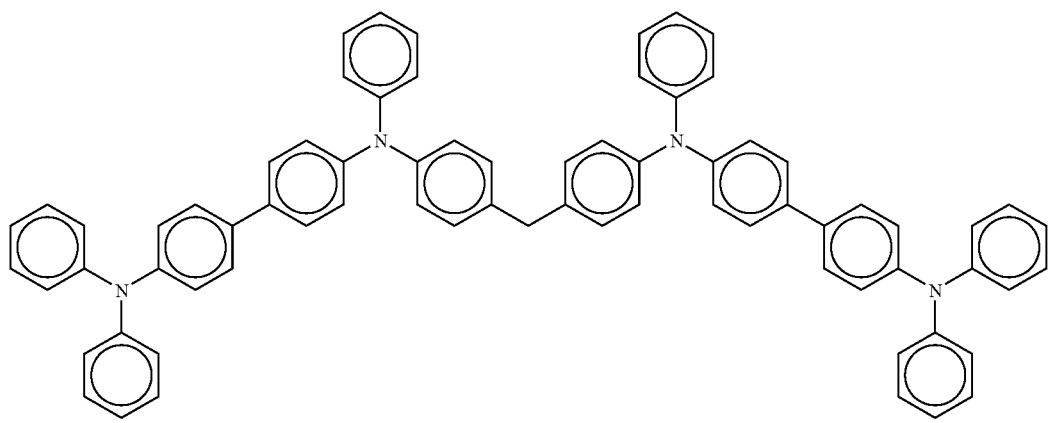
Compound 3
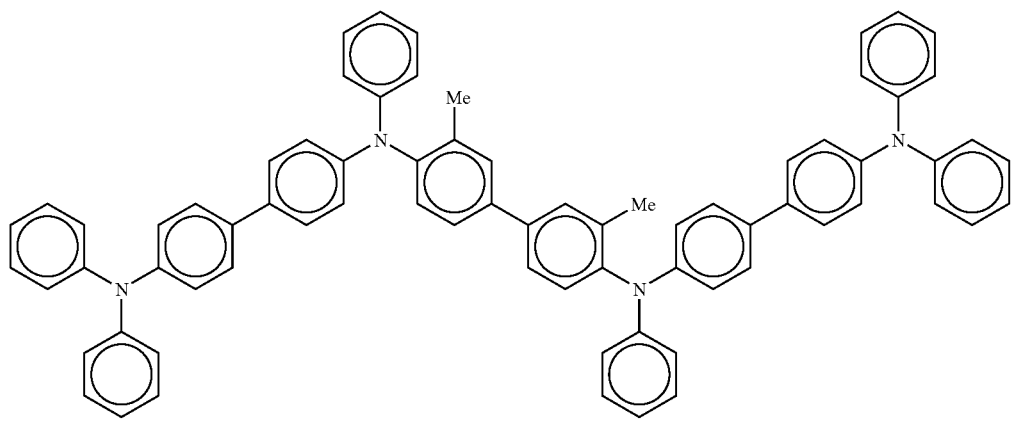
Compound 4
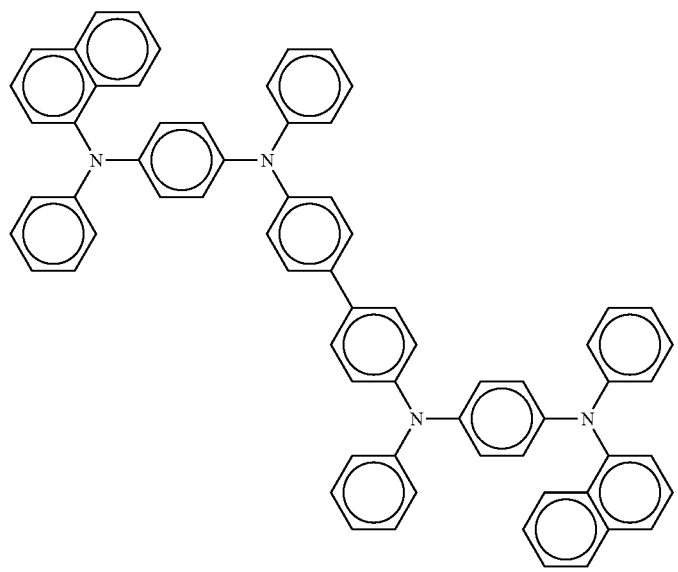

Compound 5
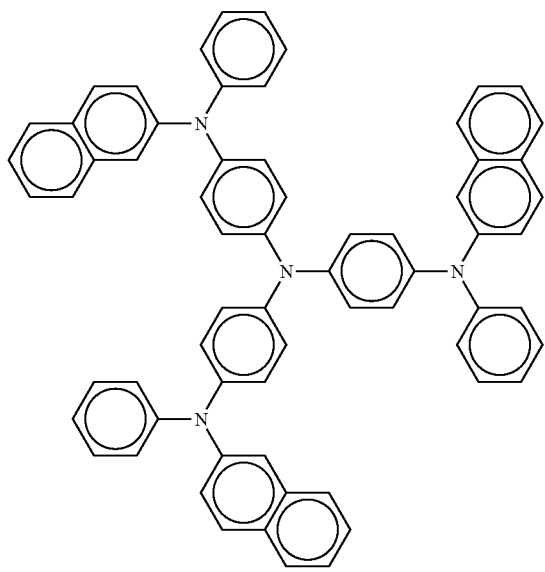
Compound 6
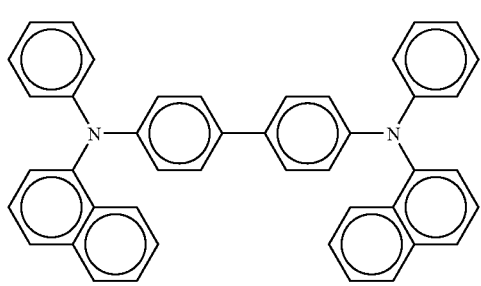
Compound 7
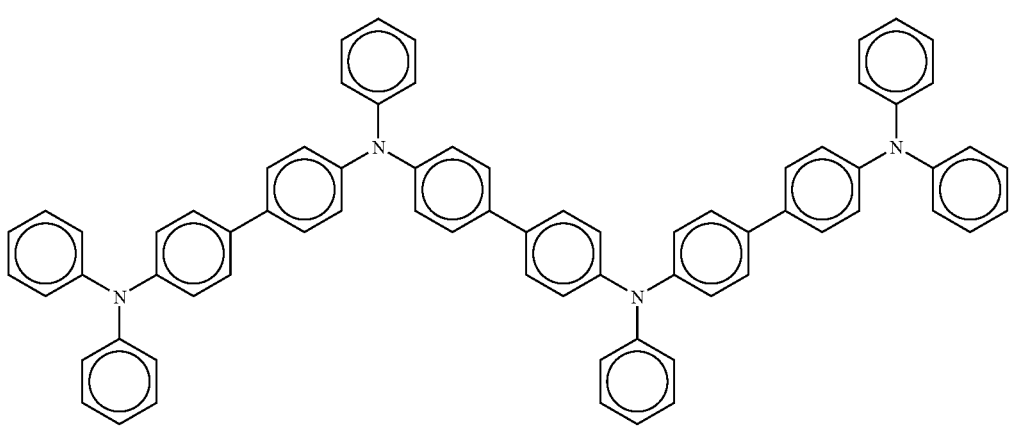
Compound 8
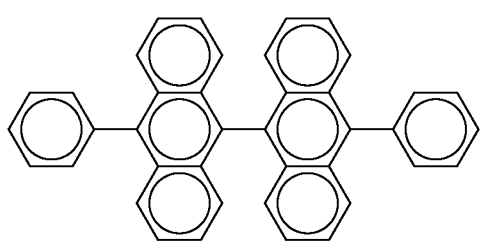

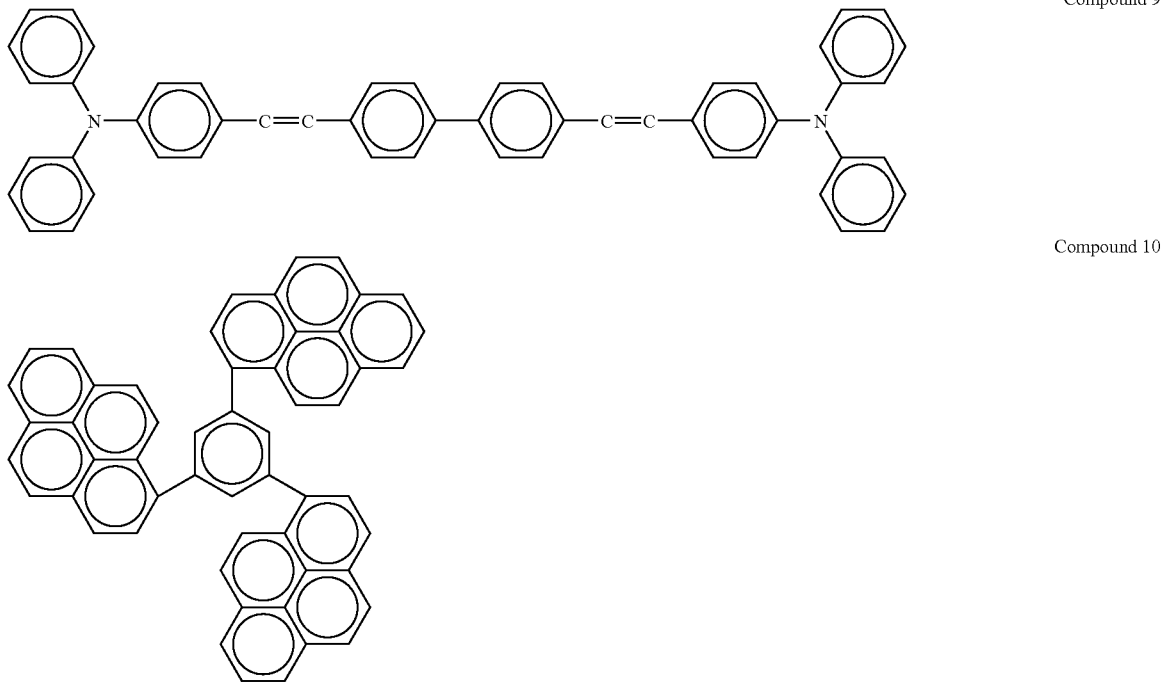

Compound 9

Compound 10

Preparation of Compounds 1 to 10

The preparation of Compounds 1 to 7 are described hereinafter. The preparation of the remaining compounds (Compounds 8 to 10) is omitted herein because they are well-known in this field and are commercially available.

Compound 1

9,9-bis{4-[4'-(4-diphenylaminophenyl) triphenylamino]}-fluorene 20.3 g (0.15 moles) of acetoanilide, 73.1 g (0.18 moles) of 4,4'-diiodobiphenyl, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 40.2 g (yield: 64.8%) of N-(4'-iodo-4-biphenyl)acetoanilide.

Next, 13.2 g (0.032 moles) of N-(4'-iodo-4-biphenyl) acetoanilide, 6.60 g (0.039 moles) of diphenylamine, 5.53 g (0.040 moles) of anhydrous potassium carbonate, 0.45 g (0.007 mmoles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.649 (0.040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 10.5 g (yield: 72.2%) of N,N,N'-triphenylbenzidine.

Thereafter, 8.66 g (0.021 moles) of N,N,N'-triphenylbenzidine, 5.7 g (0.01 mole) of 9,9-bis-(4-iodophenyl)fluorene, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 5.7 g (yield: 50.0%) of 9,9-bis{4-[4-(4-diphenylaminophenyl)triphenylamino]}fluorene.

Compound 2

N,N'-bis[4-(4'-diphenylaminobiphenyl)]-N,N'-diphenyl-1,1'-bis(4-aminophenyl)-methylene 20.3 g (0.15 moles) of acetoanilide, 73.1 g (0.18 moles) of 4,4'-diiodobiphenyl, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 40.2 g (yield; 64.8%) of N-[4-(4'-iodobiphenyl)]acetoanilide.

Next, 13.2 g (0.032 moles) of N-[4-(4'-iodobiphenyl)] acetoanilide, 6.60 g (0.039 moles) of diphenylamine, 5.53 g (0.040 moles) of anhydrous potassium carbonate, 0.45 g (0.007 moles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.64 g (0.040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 10.5 g (yield: 72.2%) of N,N,N'-triphenylbenzidine.

Thereafter, 8.66 g (0.021 moles) of N,N,N'-triphenylbenzidine, 4.20 g (0.01 mole) of (4,4'-diiodo)methylenebiphenyl, 2.90 g (0.021 mmoles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 4.95 g (yield; 50.0%) of N,N'-bis[4-(4'-diphenylaminobiphenyl)]-N,N'-diphenyl-1,1'-bis(4-aminophenyl)-methylene.

Compound 3

N,N'-bis[4-(4'-diphenylaminobiphenyl)]-N,N'-diphenyl-[1,1'-(3,3'-dimetyl)-biphenyl-4,4'-diamine]

20.3 g (0.15 moles) of acetoanilide, 73.1 g (0.18 moles) of 4,4'-diiodobiphenyl, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 40.2 g (yield: 64.8%) of N-[4-(4'-iodobiphenyl)]acetoanilide.

Next, 13.2 g (0.032 moles) of N-[4-(4'-iodobiphenyl)] acetoanilide, 6.60 g (0.039 moles) of diphenylamine, 5.53 g (0.040 moles) of anhydrous potassium carbonate, 0.45 g (0.007 moles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.64 g (0.040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 10.5 g (yield: 72.2%) of N,N,N'-triphenylbenzidine.

Thereafter, 8.66 g (0.021 moles) of N,N,N'-triphenylbenzidine, 4.34 g (0.01 mole) of 3,3'-dimethyl-4,4'-diiodobiphenyl, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 4.31 g (yield: 43.0%) of N,N'-bis[4-(4'-diphenylaminobiphenyl)]-N,N'-diphenyl-[1,2'-(3,3'-dimetyl)-biphenyl-4,4'-diamine].

Compound 4

N,N'-bis{4-[(1-naphtyl)phenylamino]phenyl)}-N,N'-diphenylbenzidine 20.3 g (0.15 moles) of acetoanilide, 59.4 g (0.18 moles) of 1,4-diiodobenzene, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 30.3 g (yield: 60%) of N-(4-iodophenyl)acetoanilide.

Next, 10.8 (0.032 moles) of N-(4-iodophenyl)acetoanilide, 8.0 g (0.039 moles) of (1-naphtyl)phenylamine, 5.53 g (0.040 moles) of anhydrous potassium carbonate, 0.45 g (0.007 moles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.64 g (0.040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 8.6 g (yield: 70.0%) of N,N'-diphenyl-N-(1-naphtyl)-1,4-phenyldiamine.

Thereafter, 8.11 g (0.021 moles) of N,N'-diphenyl-N-(1-naphtyl)-1,4-phenyldiamine, 4.06 g (0.01 mole) of 4,4'-diiodobiphenyl, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 4.2 g (yield: 45.0%) of N,N'-bis{4-[(1-naphtyl)phenylamino]phenyl)}-N,N'-diphenylbenzidine.

Compound 5

4,4',4''-tris[(1-naphtyl)phenylamino]tripnenylamine 28.7 g (0.046 moles) of 4,4',4''-triiodotriphenylamine, 50.4 g (0.23 moles) of N-(1-naphtyl)aniline, 44.2 g (0.32 moles) of anhydrous potassium carbonate, 4.32 g (0.068 moles) of copper powders and 50 ml of decalin were added to a reaction container of 200 ml, and the mixture was heated in an oil bath at 220° C. for 24 hours in an argon atmosphere.

After completion of the reaction, 200 ml of toluene was added to the reaction product, followed by filtering to remove the insoluble. The filtrate was washed with water, and dried on sodium sulfate. After drying, the solvent was evaporated from the filtrate, and the residue was purified four times on a column chromatography using silica gel as a carrier and a mixture of n-hexane and toluene as a developing solvent. The recrystallization process was repeated using a mixture of n-hexane and toluene and ethyl acetate, followed by vacuum drying. 24.7 g (yield: 60.0%) of 4,4',4''-tris[(1-naphtyl)phenylamino]tripnenylamine was obtained.

The resulting product was further purified by sublimation to obtain a high purity 4,4',4''-tris[(1-naphtyl)phenylamino] tripnenylamine (yield of sublimation purification: 70.0%).

Compound 6

N,N'-di(1-naphtyl)-N,N'-diphenylbenzidine 4.6 g (0.021 moles) of (1-naphtyl)phenylamine, 4.06 g (0.01 mole) of 4,4'-diiodobiphenyl, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 2.6 g (yield: 45.0%) of N,N'-di(1-naphtyl)-N,N'-diphenylbenzidine.

Compound 7

N,N'-bis[4-(4'-diphenylaminobiphenyl)]-N,N-diphenylbenzidine 20.3 g (0.15 moles) of acetoanilide, 73.1 g (0.18 moles) of 4,4'-diiodobiphenyl, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 40.2 g (yield: 64.8%) of N-[4-(4'-iodobiphenyl)]acetoanilide.

Next, 13.2 g (0.032 moles) of N-[4-(4'-iodobiphenyl)] acetoanilide, 6.60 g (0.039 moles) of diphenylamine, 5.53 g (0.040 moles) of anhydrous potassium carbonate, 0.45 g (0.007 moles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.64 g (0.040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 10.5 g (yield: 72.2%) of N,N,N'-triphenylbenzidine.

Thereafter, 8.66 g (0.021 moles) of N,N,N'-triphenylbenzidine, 4.06 g (0.01 mole) of 4,4'-diiodobiphenyl, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 4.73 g (yield: 48.5%) of N,N'-bis[4-(4'-diphenylaminobiphenyl)]-N,N'-diphenylbenzidine.

Properties of Compounds 1 to 10

The properties of Compounds 1 to 10 except for Compound 9 used as a light-emitting additive material are summarized as follows.

Compounds 1 to 7

Compounds 1 to 7 (tertiary amine compound) used as the hole-transporting material have the following properties.

| Glass transition temperature (Tg): | |
|---|---|
| Compound 1: | 162° C. |
| Compound 2: | 133° C. |
| Compound 3: | 139° C. |
| Compound 4: | 132° C. |
| Compound 5: | 112° C. |
| Compound 6: | 96° C. |
| Compound 7: | 144° C. |

As is appreciated, all of Compounds 1 to 7 except for Compound 6 have a glass transition temperature of not less than 100° C.

| Ionization potential (Ip): | |
|---|---|
| Compound 1: | 5.50 eV |
| Compound 2: | 5.50 eV |
| Compound 3: | 5.50 eV |
| Compound 4: | 5.30 eV |
| Compound 5: | 5.20 eV |
| Compound 6: | 5.47 eV |
| Compound 7: | 5.40 eV |

As is appreciated, Compounds 1 to 3 and 6 each has an ionization potential of not less than 5.45 eV. Note that the ionization potential was determined in the photoelectric measuring apparatus "AC-2" commercially available from Riken Keiki Kabushiki Kaisha.

Oxidation Potential:

The oxidation potential of each compound was determined by applying a potential variation to a solution containing each compound (used as the hole-transporting material in the formation of the light-emitting layer) in accordance with the conventional cyclic voltammetric method.

As a result, the following oxidation potential differences (difference between the first and second oxidation potentials) were determined.

| | |
|---|---|
| Compound 1: | 0.18 V |
| Compound 2: | 0.2 V |
| Compound 3: | 0.23 V |
| Compound 4: | 0.51 V |
| Compound 5: | 0.23 V |
| Compound 6: | 0.25 V |
| Compound 7: | 0.19 V |

As is appreciated, Compounds 3 to 6 each has an oxidation potential difference of not less than 0.22 v.

Further, Compounds 1 to 7 were examined with regard to the symmetry of the profile of the oxidation side curve and that of the reduction side curve in the oxidation-reduction characteristic curve plotted by the cyclic voltammetric method. As a result, it was observed that Compounds 1 to 3, 6 and 7 each has a symmetric curve in the oxidation side curve and the reduction side curve.

Figure 3:
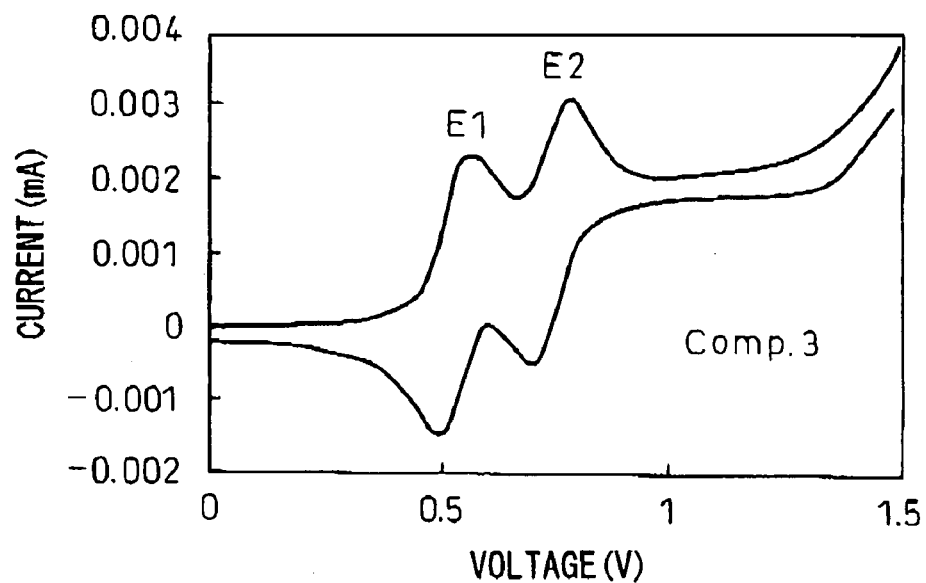
FIG. 3 is a graph plotting the relation between the voltage and the electric current, determined by a cyclic voltammetry, in Compound 3.
Figure 4:
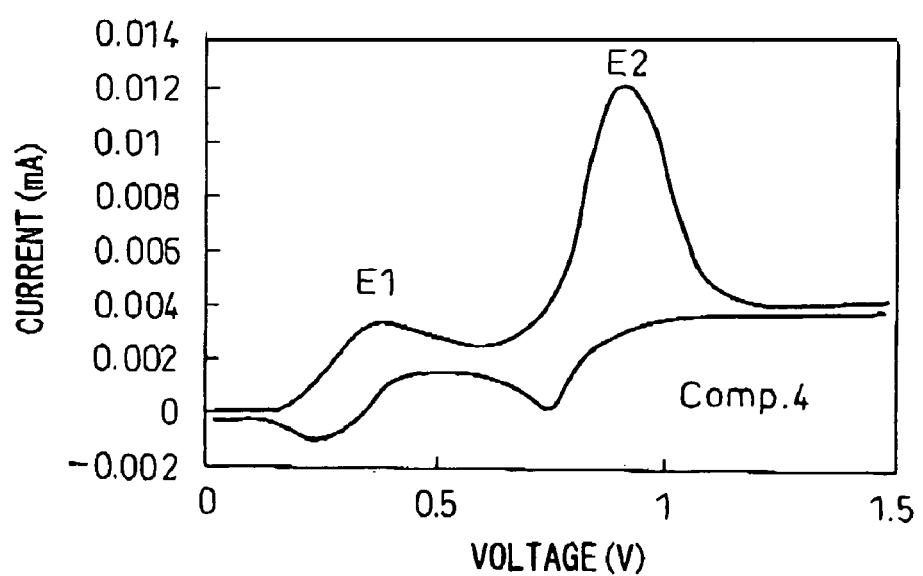
FIG. 4 is a graph plotting the relation between the voltage and the electric current, determined by a cyclic voltammetry, in Compound 4.

For the reference, examples of the determination of the oxidation potential by the cyclic voltammetric method are plotted in FIGS. 3 and 4 which show the determination results of Compounds 3 and 4, respectively. The cyclic voltammetric method was carried out as follows.

| | |
|---|---|
| Reference electrode: | saturated calomel electrode |
| Work electrode: | platinum electrode |
| Counter electrode: | platinum electrode |
| Supporting electrolyte: | tetra-n-butyl ammonium chlorate |

Test sample: methylene chloride solution containing 1 mmol/l of sample and 0.1 mmol/l of electrolyte Determination: room temperature; sweeping rate: 100 mV/sec (triangular wave)

Referring to FIGS. 3 and 4, an oxidation potential difference is calculated as a difference between the lowest first oxidation potential E1 and the second lower oxidation potential E2, Further, it is observed that Compound 3 in FIG. 3 shows a symmetric profile in the oxidation side and the reduction side of the plotted oxidation-reduction curve, while Compound 4 in FIG. 4 does not have such a symmetric profile in the oxidation-reduction curve.

Among Compounds 1 to 7, Compounds 3, 4 and 5 each satisfies the requirements concerning the glass transition temperature of at least 100° C. and the oxidation potential difference, determined by the cyclic voltammetric method, of at least 0.22V. It is noted that these tertiary amine compounds each has four triphenylamines in a molecule thereof.

Moreover, among Compounds 3, 4 and 5, Compounds 4 and 5 each does not have a substituent in a ortho position of the phenyl group of the contained triphenylamine. On the other hand, Compound 3 represents a tertiary amine compound containing a substituent in a ortho position of the phenyl group of the contained triphenylamine and having a molecular weight of less than 1,100.

Compounds 8 and 10

Compounds 8 and 10 used as the electron-transporting material have the following properties.

| | |
|---|---|
| Glass transition temperature (Tg): | |
| Compound 8: | 175° C. |
| Compound 10: | 164° C. |
| Ionization potential (IP): | |
| Compound 8: | 5.85 eV |
| Compound 10: | 5.75 eV |

Note that the ionization potential was determined in the photoelectric measuring apparatus "AC-2" commercially available from Riken Keiki Kabushiki Kaisha.

Evaluation of Compounds 1 to 10

Using Compounds 1 to 10 described above, the organic EL devices S1 illustrated in FIG. 2 were produced, and their device characteristics such as luminescence durability and emission efficiency were determined and evaluated in accordance with the methods described below. The results are summarized in the following Table 1.

TABLE 1

| Example | TEMP | HTM | ETM | LEAM | LD | HTS | EE | OPD (v) | SYM | Tg (° C.) | Ip (eV) |
|---|---|---|---|---|---|---|---|---|---|---|---|
| 1-1 | 260° C. | Comp. 1 | Comp. 8 | Comp. 9 | 0.7 | o | 6.5 | 0.18 | o | 162 | 5.50 |
| 1-2 | 280° C. | | | | 0.9 | | | | | | |
| 2-1 | 260° C. | Comp. 2 | Comp. 8 | Comp. 9 | 0.7 | o | 6.0 | 0.2 | o | 133 | 5.50 |
| 2-2 | 280° C. | | | | 0.9 | | | | | | |
| 3-1 | 260° C. | Comp. 3 | Comp. 8 | Comp. 9 | 0.9 | o | 6.0 | 0.23 | o | 139 | 5.50 |
| 3-2 | 280° C. | | | | 0.9 | | | | | | |
| 4-1 | 260° C. | Comp. 4 | Comp. 8 | Comp. 9 | 0.85 | o | 3.0 | 0.51 | x | 132 | 5.30 |
| 4-2 | 280° C. | | | | 0.85 | | | | | | |
| 5-1 | 260° C. | Comp. 5 | Comp. 8 | Comp. 9 | 0.85 | o | 2.0 | 0.23 | x | 112 | 5.20 |
| 5-2 | 280° C. | | | | 0.85 | | | | | | |
| 6-1 | 260° C. | Comp. 6 | Comp. 8 | Comp. 9 | 0.9 | x | 5.0 | 0.25 | o | 96 | 5.47 |
| 6-2 | 280° C. | | | | 0.9 | | | | | | |
| 7-1 | 260° C. | Comp. 7 | Comp. 8 | Comp. 9 | 0.7 | o | 4.0 | 0.19 | o | 144 | 5.40 |
| 7-2 | 280° C. | | | | 0.9 | | | | | | |

TABLE 1-continued

| Example | TEMP | HTM | ETM | LEAM | LD | HTS | EE | OPD (v) | SYM | Tg (° C.) | Ip (eV) |
|---|---|---|---|---|---|---|---|---|---|---|---|
| 8-1 | 350° C. | Comp. 1 | Comp. 10 | Comp. 9 | 0.6 | ○ | 6.5 | 0.2 | ○ | 162 | 5.50 |
| 8-2 | 350° C. | Comp. 2 | Comp. 10 | Comp. 9 | 0.6 | ○ | 6.0 | 0.2 | ○ | 133 | 5.50 |
| 8-3 | 350° C. | Comp. 3 | Comp. 10 | Comp. 9 | 0.7 | ○ | 6.0 | 0.23 | ○ | 139 | 5.50 |
| 8-4 | 350° C. | Comp. 4 | Comp. 10 | Comp. 9 | 0.87 | ○ | 3.0 | 0.51 | x | 135 | 5.30 |
| 8-5 | 350° C. | Comp. 5 | Comp. 10 | Comp. 9 | 0.85 | ○ | 2.0 | 0.23 | x | 112 | 5.20 |
| 8-6 | 380° C. | Comp. 3 | Comp. 10 | Comp. 9 | 0.75 | ○ | 6.0 | 0.23 | ○ | 139 | 5.50 |

Referring to Table 1, the abbreviations used in the upper column represent the following items:

TEMP: heating temperature (° C.) of the electron-transporting material applied to the formation of the light-emitting layer 50 through vapor deposition;

HTM: hole-transporting material;

ETM: electron-transporting material;

LEAM: light-emitting additive material;

LD: luminescence durability;

HTS: high temperature storage;

EE: emission efficiency;

OPD: oxidation potential difference (V);

SYM; symmetry of the oxidation-reduction curve;

Tg: glass transition temperature (° C.); and

Ip: ionization potential (eV).

In the evaluation of the device characteristics, the luminescence durability was determined referring to the normalized luminescence. The normalized luminescence was determined by subjecting the EL device produced in each example to a durability test under the following conditions; circumstance temperature of 85° C., initial luminescence of 400 cd/m² and 1/64 duty driving. For the normalization, the luminescence measured after driving of 400 hours was assigned as an initial luminescence of 1.

The high temperature storage is intended to represent a heat resistance at 100° C. or more, and was determined by subjecting the EL device to a storage test at 100° C. In this test, the device showing no generation of dark spots was evaluated to be ○, and the device showing some dark spots was evaluated to be x.

The emission efficiency represents an initial emission efficiency, i.e., the emission efficiency (cd/A) determined at the initial luminescence of 400 cd/m².

The oxidation potential difference, the symmetry of the oxidation-reduction curve, Tg and Ip represent an oxidation potential difference of the hole-transporting material, a symmetry of the oxidation side and the reduction side in the oxidation-reduction curve, a glass transition temperature and an ionization potential, respectively. Note in the column of the symmetry of the oxidation-reduction curve that ○ means presence of symmetry in the curve, and x means absence of symmetry in the curve.

EXAMPLES

Each of the examples in Table 1 described above is further described with regard to the production and examination of the EL device.

Example 1-1

An ITO coating (transparent electrode) was formed as an anode 20 on the glass substrate 10, and a surface of the ITO coating was polished to obtain a surface roughness of Ra of about 1 nm and Rz of about 10 nm.

A hole-injecting layer 30 consisting of CuPc as an organic material having a crystallinity was formed at a thickness of 10 nm on the anode 20. Then, to form a hole-transporting layer 40, Compound 1 (tertiary amine compound) was formed at a thickness of 20 nm on the hole-injecting layer 30.

A light-emitting layer 50 was formed at a thickness of 20 nm on the hole-transporting layer 40. The light-emitting layer 50 was formed from Compound 1 (tertiary amine compound), Compound 8 (electron-transporting material) and Compound 9 (light-emitting additive material) in a weight ratio of 60:20:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 1-2

The procedure of Example 1-1 was repeated with the proviso that, in the formation of the light-emitting layer 50, the heating temperature of Compound 8 (electron-transporting material) was increased to 280° C.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 2-1

The procedure of Example 1-1 was repeated with the proviso that Compound 2 was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 2-2

The procedure of Example 1-2 was repeated with the proviso that Compound 2 was used as the tertiary amine compound in the formation of the hole-transporting layer 40 and the light-emitting layer 50.

The EL device was subjected to the durability test under the conditions; circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 3-1

The procedure of Example 1-1 was repeated with the proviso that Compound 3 was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 3-2

The procedure of Example 1-2 was repeated with the proviso that Compound 3 was used as the tertiary amine compound in the formation of the hole-transporting layer 40 and the light-emitting layer 50.

The EL device was subjected to the durability test under the conditions; circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 4-1

The procedure of Example 1-1 was repeated with the proviso that Compound 4 was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 4-2

The procedure of Example 1-2 was repeated with the proviso that Compound 4 was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 5-1

The procedure of Example 1-1 was repeated with the proviso that Compound 5, i.e., starburst-type triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 5-2

The procedure of Example 1-2 was repeated with the proviso that Compound 5, i.e., starburst-type triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that no remarkable dark spot is generated over 500 hours.

Example 6-1

The procedure of Example 1-1 was repeated with the proviso that Compound 6, i.e., triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that dark spots were generated.

Example 6-2

The procedure of Example 1-2 was repeated with the proviso that Compound 6, i.e., triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m² and 1/64 duty driving. The results described in Table 1 were obtained. Further, it was observed in the storage test under the circumstance temperature of 100° C. that dark spots were generated.

Example 7-1

The procedure of Example 1-1 was repeated with the proviso that Compound 7, i.e., triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 7-2

The procedure of Example 1-2 was repeated with the proviso that Compound 7, i.e., triphenylamine derivative, was used as the tertiary amine compound in the formation of the hole-transporting layer 40 and the light-emitting layer 50.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours,

Example 8-1

The procedure of Example 1-1 was repeated with the proviso that Compound 10 was used as the hole-transporting material in the formation of the light-emitting layer 50. The heating temperature of Compound 10 was adjusted to 350° C.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 8-2

The procedure of Example 2-1 was repeated with the proviso that Compound 10 was used as the hole-transporting material in the formation of the light-emitting layer 50. The heating temperature of Compound 10 was adjusted to 350° C.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 8-3

The procedure of Example 3-1 was repeated with the proviso that Compound 10 was used as the hole-transporting material in the formation of the light-emitting layer 50. The heating temperature of Compound 10 was adjusted to 350° C.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 8-4

The procedure of Example 4-1 was repeated with the proviso that Compound 10 was used as the hole-transporting material in the formation of the light-emitting layer 50. The heating temperature of Compound 10 was adjusted to 350° C.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 8-5

The procedure of Example 5-1 was repeated with the proviso that Compound 10 was used as the hole-transporting material in the formation of the light-emitting layer 50. The heating temperature of Compound 10 was adjusted to 350° C.

The EL device was subjected to the durability test under the conditions; circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Example 8-6

The procedure of Example 8-3 was repeated with the proviso that the heating temperature of Compound 10 was increased to 380° C.

The EL device was subjected to the durability test under the conditions: circumstance temperature of 85° C., initial luminescence of 400 cd/m$^2$ and 1/64 duty driving. The results described in Table 1 were obtained. Further, it was observed in the storage test under the circumstance temperature of 100° C. that no remarkable dark spot is generated over 500 hours.

Analysis of Examples

Each of the examples described above is further described with regard to the features and others based on the results described in Table 1.

As described in Table 1, in Examples 3-1, 4-1, 5-1, 8-4 and 8-5, both of the tertiary amine compound as the hole-transporting material and the electron-transporting material used have a glass transition temperature of at least 100° C., and the tertiary amine compound as the hole-transporting material has an oxidation potential difference of at least 0.22V. Thus, the improvement in the luminescence durability and the establishment in the heat resistance at 100° C. or more can be simultaneously attained in these examples.

This is considered to be because of the glass transition temperature of the hole-transporting material and the electron-transporting material in the light-emitting layer 50 is at least 100° C., and the oxidation potential difference of at least 0.22V. These features are effective to inhibit the hole transfer from the first oxidation potential to the second oxidation potential in the hole-transporting material and thus inhibit the hole transfer to the electron-transporting material, thereby inhibiting the deterioration of the electron-transporting material.

In this connection, it is noted in Examples 1-1 and 8-1 using the hole-transporting material having the oxidation potential difference of less than 0.22V that the luminescence durability is lowered even if the light-emitting layer 50 is formed from a mixed host. Generally, it is considered that when the light-emitting layer is formed from the mixed host, a luminescence durability of the device can be improved because the hole-transporting function and the electron-transporting function are independently realized in the light-emitting layer. Therefore, the inventors have examined the effects of the mixed host constituting the light-emitting layer on the improvement of the luminescence durability.

For the comparison purpose, Examples 1-1, 2-1, 3-1, 4-1, 5-1, 6-1 and 7-1 were repeated with the proviso that the light-emitting layer 50 was formed without using a mixed host. The results are summarized in the following.

TABLE 2

| Example | with mixed layer | | no mixed layer | |
|---------|------|-----|------|-----|
|         | LD   | EE  | LD   | EE  |
| 1-1     | 0.7  | 6.5 | 0.66 | 5   |
| 2-1     | 0.7  | 6   | 0.65 | 5   |
| 3-1     | 0.9  | 6   | 0.66 | 5   |
| 4-1     | 0.85 | 3   | 0.63 | 6   |
| 5-1     | 0.85 | 2   | 0.6  | 5   |
| 6-1     | 0.9  | 5   | 0.68 | 5   |
| 7-1     | 0.7  | 4   | 0.65 | 6   |

LD: luminescence durability
EE: emission efficiency

Referring to Table 2, the luminescence durability (LD) and the emission efficiency (EE) of Examples 1-1, 2-1, 3-1, 4-1, 5-1, 6-1 and 7-1 are described in the column "with mixed layer". In the column "no mixed layer", there are described the luminescence durability (LD) and the emission efficiency (EE) of the comparative examples which correspond to Examples 1-1, 2-1, 3-1, 4-1, 5-1, 6-1 and 7-1 except that the light-emitting layer was formed without using a mixed host, i.e., using a single host. Note in each of the comparative examples indicated with "no mixed layer" that the light-emitting layer was formed from Compound 8 as the hole-transporting material and Compound 9 as the light-emitting additive material in a weight ratio of 100:5 at a thickness of 200 nm.

As is appreciated from Table 2, a luminescence durability could be improved in all of Examples 1-1, 2-1, 3-1, 4-1, 5-1, 6-1 and 7-1, because the light-emitting layer was formed from the mixed host. Here, it is considered in the light-emitting layer constituted from a layer of the mixed host, i.e., a layer formed by mixing a hole-transporting material consisting of a tertiary amine compound, an electron-transporting material and a light-emitting additive material, that the resulting inhibition in the reduction of the luminescence is based on the following mechanism.

When the light-emitting layer is formed from a single host material, light emission is considered to be generated in accordance with the following formula:

$$H^+ + H^- + D \rightarrow (H^* + D) \rightarrow H + D^* \rightarrow H + D$$

in which H is a molecule of the charge (hole or electron)-transporting material, i.e., molecule of host material, D is a molecule of the light-emitting additive material, i.e., molecule of guest material, and * represents a singlet excitation state.

As the host material used is single, the light emission is generated as a result of the charge transfer from each of the polar ions $H^+$ and $H^-$ of the host material molecule H to the guest material molecule D, or as a result of the charge transfer from the excited state $H^*$ of the host material molecule H to the guest material molecule D.

On the other hand, when the light-emitting layer is constituted from a mixed host layer, light emission is considered to be generated in accordance with the following formula:

$$Ha^+ + Hb^- + D \rightarrow Ha + Hb + D^* \rightarrow Ha + Hb + D$$

in which Ha and Hb each is a molecule of the host material, and Ha is a molecule of the hole-transporting material and Hb is a molecule of the electron-transporting material. D is a molecule of the light-emitting additive material, i.e., molecule of guest material, and * represents a singlet excitation state.

As the host materials Ha and Hb show a largely increased shift in their energy bands, no charge transfer is generated between these materials. Thus, the host materials are not converted to an excitation state, and as a result of the charge transfer to the guest material molecule D, light emission is generated as the guest molecule is converted to an excitation state $D^*$.

As is appreciated, the deterioration of the host materials are hardly caused, because the host molecules Ha and Hb are not converted to an excitation state. This is considered to be one cause of obtaining an improvement in the luminescence durability in the mixed host layer.

However, even if the light-emitting layer is formed from the mixed host layer, there is a possibility that the excitation of the electron-transporting material can be easily generated depending upon a combination of the hole-transporting material and the electron-transporting material used as the host material. According to the embodiment of the present invention described herein, such a combination can be excluded, and thus the excitation of the electron-transporting material can be inhibited, along with the improvement of the luminescence durability.

That is, as is appreciated from Examples 3-1, 4-1, 5-1, 8-4 and 8-5, if the tertiary amine compound used as the hole-transporting material has an oxidation potential difference of at least 0.22V, the deterioration of the electron-transporting material can be inhibited, along with the improvement of the luminescence durability.

Further, if the tertiary amine compound as the hole-transporting material and the electron-transporting material both have a glass transition temperature of at least 100° C., a storage stability at a high temperature can be obtained, and thus the generation of dark spots can be prevented even if the EL device is subjected to a higher temperature of 100° C. or more. Contrary to this, it was observed that Compound 6, described above, can generate dark spots during high temperature storage, because of its low glass transition temperature of less than 100° C.

Figure 5:
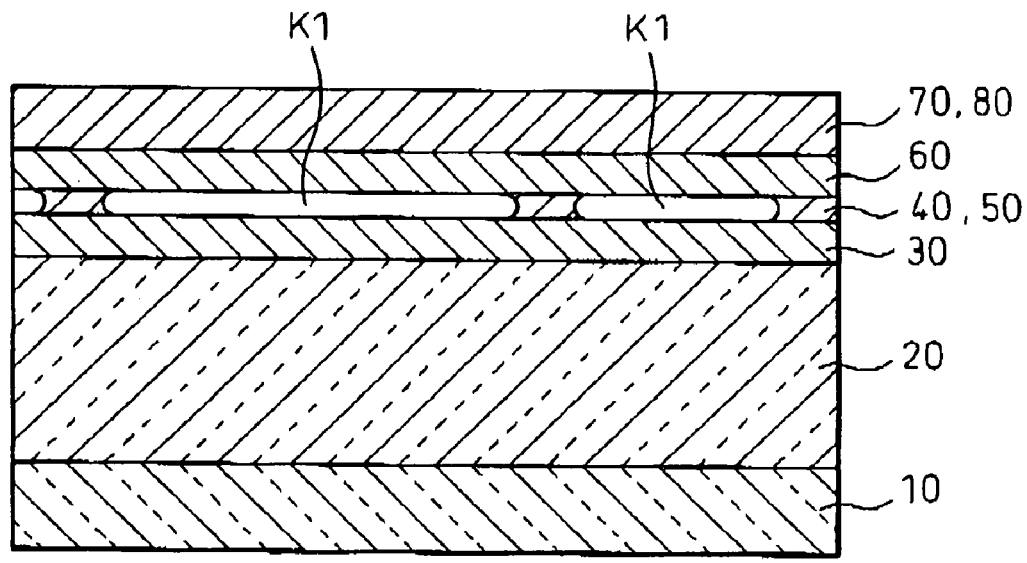
FIG. 5 is a cross-sectional view showing causes of the dark spot problem in the organic EL device.

The inventors have examined the reasons why the dark spots are generated in the EL device, and the results are schematically illustrated in FIG. 5. FIG. 5 is a schematic cross-sectional view corresponding to the scanning electron microphotograph (SEM) of the organic EL device produced in accordance with the manner of Example 6-1 using Compound 6 after storage at 120° C. for 500 hours.

It was observed in the SEM of the device that voids K1 were partially formed in the layers containing the hole-transporting material, i.e., the hole-transporting layer 40 and the light-emitting layer 50. Since the electric current is not induced in these voids K1, it is considered that the voids K1 can produce non-light emission areas which are then observed as dark spots by users. It is also considered that the voids K1 were produced as a function of the crystallization of the hole-transporting material with variation of the volume, because the environmental temperature is higher than the glass transition temperature of the material used.

Further, Compounds 3 to 5 used as the hole-transporting material in Examples 3-1, 4-1, 5-1, 8-4 and 8-5 each has four triphenylamines in a molecule thereof, and also they suitably satisfy the above-described requirements concerning the glass transition temperature of at least 100° C. and the relation of the oxidation potential difference.

That is, these tertiary amine compounds containing four triphenylamines have a glass transition temperature of at least 100° C. and can easily realize the relation of the oxidation potential difference, and also enable to use a wide variety of tertiary amine compounds because the molecule design can be widely varied in these compounds.

Furthermore, one example of the tertiary amine compound having a glass transition temperature of at least 100° C. includes a simply polymerized product of triphenylamine, for example, Compound 7 described above. Compound 7 has a glass transition temperature of at least 100° C., but its oxidation potential difference is small as 0.19V. Due to small oxidation potential difference, the resulting luminescence durability is a low level as is evidenced in Example 7-1.

The above result is considered to be because the first and second oxidation potentials can be closely approached as a function of extension of the conjugation (resonance) upon simple polymerization of the triphenylamines. Contrary to this, when the tertiary amine compound used has a structure capable of increasing the steric hindrance or breaking the conjugation as is shown in Compounds 1 to 5, more increased oxidation potential differences can be obtained.

Here, one means for breaking the conjugation includes introduction of a substituent in an ortho position of the phenyl group of triphenylamine, thereby providing a steric hindrance, as in Compound 3 described above. However, since the resulting steric hindrance portion is thermally weak, particularly when the compound has a relatively large molecular weight, the compound may be thermally decomposed upon heating during vapor deposition.

Therefore, it is preferred that the tertiary amine compounds having no substituent in an ortho position of the phenyl group of triphenylamine such as Compounds 4 and 5 described above are used in the formation of the light-emitting layer 50. Since the tertiary amine compounds having no ortho-substituent are generally difficult to be thermally decomposed and thus the temperature can be easily controlled during layer formation, it becomes possible to realize a stable layer formation.

However, the inventors have found during their experiments that some of the tertiary amine compounds having a substituent in an ortho position of the phenyl group of triphenylamine can be stably used in the formation of the light-emitting layer without suffering from the adverse effects of thermal decomposition, if the compounds have a molecular weight of less than 1,000. For example, Compound 3 is included in the scope of these compounds.

In this connection, the inventors have examined another tertiary amine compound having a substituent in an ortho position of the phenyl group of triphenylamine represented by the following formula. The tertiary amine compound used herein has a molecular weight of 1,102, and is referred hereinafter to as "Compound 11".

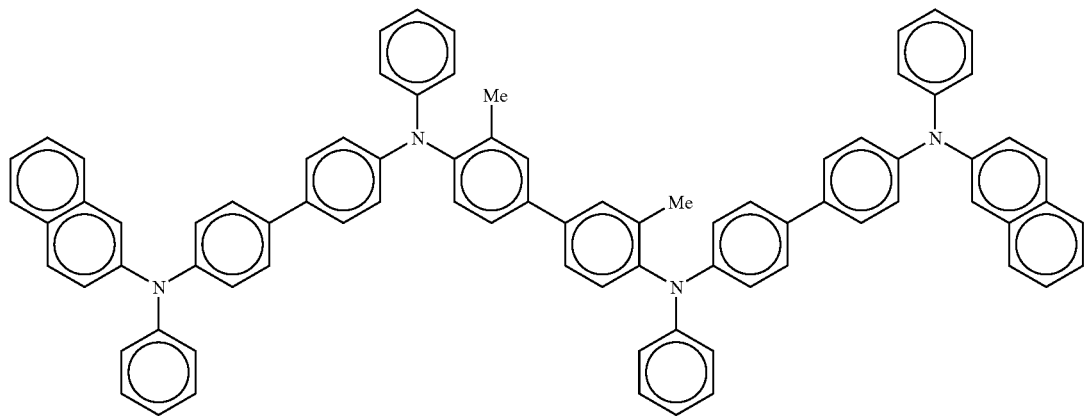

Compound 11

Using Compound 11, it was observed during formation of the light-emitting layer that a vacuum degree during the vapor deposition was varied with the variation of the heating temperature applied. The variation is considered to be because a gas was generated upon decomposition of Compound 11, and heat was developed in the compound itself. It is noted that the deposition rate applied herein is 0.1 nm/sec which is smaller than the deposition rate generally used in the conventional vapor decomposition processes.

In other words, when the tertiary amine compound used has a substituent in an ortho position of the phenyl group of triphenylamine, satisfactory layer formation can be accomplished only when at least the tertiary amine compound has a molecular weight of less than 1,100.

Furthermore, in the formation of the light-emitting layer 50, the tertiary amine compound having an ionization potential of at least 5.45 eV such as those used in Examples 1-1, 2-1 and 3-1 can exhibit a high emission efficiency, while the tertiary amine compound having an ionization potential of less than 5.45 eV such as those used in Examples 4-1 and 5-1 shows a low emission efficiency.

That is, it has been found that there is a relation between the ionization potential of the tertiary amine compound used in the formation of the light-emitting layer 50 consisting of a mixed host, and the resulting emission efficiency. The relation can be confirmed from Table 2 described above, and also it is considered to be specifically provided when the mixed host is used in the formation of the light-emitting layer 50.

In other words, when the light-emitting layer 50 is formed from a mixed host, the luminescence durability can be improved, but, when the tertiary amine compound used has a poor ionization potential, a reduction of the emission efficiency can not resulted.

This is considered to be because when the tertiary amine compound used as the hole-transporting material has a poor ionization potential, it becomes difficult to smoothly conduct the hole transfer from the hole-transporting material to the light-emitting additive material as a dopant (guest molecule).

Accordingly, it is preferred in the formation of the light-emitting layer 50 consisting of a mixed host that the tertiary amine compound having an ionization potential of at least 5.45 eV is used in view of ensuring the excellent emission efficiency in comparison with the prior art methods.

Furthermore, the comparison of Example 3-1 with Examples 4-1 and 5-1 shows that the former example has a somewhat longer luminescence durability than that of the latter examples. One reason of such difference in the luminescence durability resides in the difference that the tertiary amine compound used in the former example shows a symmetry of the oxidation-reduction curve, while the tertiary amine compounds used in the latter examples show an asymmetric oxidation-reduction curve.

As described above, the hole-transporting material is in a neutral condition, and upon receipt of holes, the hole-transporting material is oxidized and then the oxidized material transfers its holes to the counterpart hole-transporting material, while the material itself is reduced to again return to a neutral condition. In such a hole-transporting material, if it has a good symmetry of the oxidation-reduction curve, the hole-transporting material can easily reproduce its original hole-transporting function, after transfer of holes to another hole-transporting material.

It should be noted that, when the oxidation-reduction curve of the hole-transporting material used is asymmetric, the hole-transporting function can be hardly reproduced in the hole-transporting material after transfer of holes, and thus the hole-transporting capability is lowered. Thus, a resistance of the hole-transporting material in the light-emitting layer 50 is increased and a distribution of the emission spectrum is shifted. As a result, the emission efficiency is lowered along with reduction of the luminescence durability.

As is appreciated from the above, to more effectively inhibiting the deterioration of the luminescence durability, it is also necessary that the tertiary amine compound used in the formation of the light-emitting layer 50 has a good symmetry of the oxidation-reduction curve.

Furthermore, with regard to the ionization potential of the electron-transporting material, as is described in Table 1, the ionization potential of Compound 8 is 5.85 eV, and that of Compound 10 is 5.75 eV.

Here, it is noted in Examples 3-1, 4-1 and 8-4 described above that a difference in the ionization potential between the electron-transporting material and the hole-transporting material is at least 0.35 eV, and such ionization potential difference of at least 0.35 eV is effective in the improvement of the luminescence durability in comparison with that of Example 8-3 in which the ionization potential difference is less than 0.35 eV.

Hereinabove, the effects of the present invention were principally described particularly with reference with the hole-transporting material having an oxidation potential difference of at least 0.22V. However, as is evidenced by Examples 1-2, 2-2 and 7-2, an improvement of the luminescence durability and an establishment of the heat resistance at 100° C. or more can be simultaneously accomplished even if the oxidation potential difference is less than 0.22V.

This is because according to this embodiment of the present invention, the specific production process is applied to the production of the EL device. That is, as described in Examples 1-2, 2-2 and 7-2, the specific tertiary amine compound having four triphenylamines in the molecule and having a glass transition temperature of at least 100° C. such as Compounds 1, 2 and 7 is used in the practice of these examples.

Moreover, in combination with these tertiary amine compounds, the specific electron-transporting material having a difference in the ionization potential between the electron-transporting material and the hole-transporting material of at least 0.35 eV and a glass transition temperature of at least 100° C. such as Compounds 8 and 10 is used.

Moreover, it is noted that the same composition was applied in both of Examples 1-2, 2-2 and 7-2 and Examples 1-1, 2-1 and 7-1, but the heating temperature of the former examples was increased to 280° C. from 260° C. of the latter examples.

Upon increase of the heating temperature of the hole-transporting material as described above, the phenomenon plotted in FIG. 6 is induced.

Figure 6:
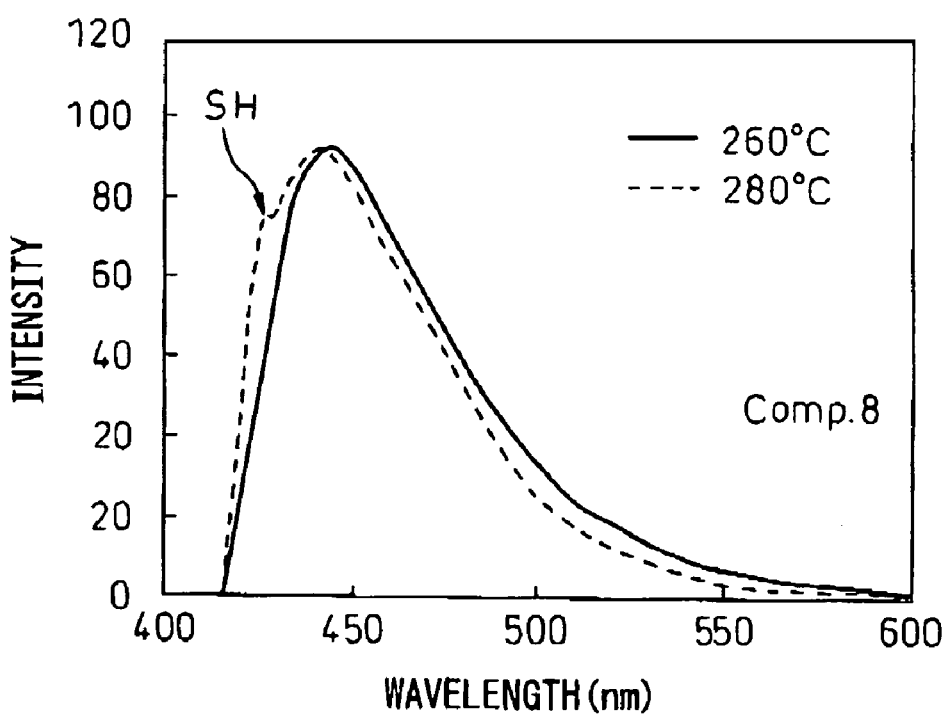
FIG. 6 is a graph showing the dependency of the fluorescence spectrum, determined in the thin layer of the electron-transporting material (Compound 8) on a glass substrate, on the heating temperature of the electron-transporting material.

FIG. 6 is a graph showing the dependency of the fluorescence spectrum, determined in the thin layer, having a thickness of about 100 nm, of the electron-transporting material (Compound 8) on a glass substrate, on the heating temperature of the electron-transporting material. Heating temperatures of 260° C. and 280° C. were applied to the electron-transporting material.

As is shown in FIG. 6, when the heating temperature of 260° C. was applied to the electron-transporting material (Compound 8), a peak of the fluorescence spectrum of the thin layer of Compound 8 is observed at a position which is at least 20 nm larger than the build-up value of the same spectrum. On the other hand, when the heating temperature was increased from 260° C. to 280° C., a shoulder SH of the fluorescence spectrum of the thin layer of Compound 8 is observed at a position which is 20 nm or less shorter than the build-up value of the same spectrum.

Note that the dependency plotted in FIG. 6 could be also confirmed after the electron-transporting material was fabricated to the form of the light-emitting layer 50, i.e., the device form. Moreover, in place of the shoulder plotted in FIG. 6, a peak of the spectrum may be created at a position which is less than 20 nm from the build-up value.

Thus, according to the present invention, it is contemplated in the formation of the light-emitting layer 50 that the deposition conditions of the electron-transporting material such as heating temperature of the material used are controlled and also the fluorescence spectrum of the thin layer of the electron-transporting material is controlled in such a manner that a peak or shoulder of the spectrum is observed at a position which is 20 nm or less from the build-up value of the same spectrum.

As a result, the specific production process based on this embodiment of the present invention is established and thus the improvement in the luminescence durability and the establishment in a heat resistance at 100° C. or more can be simultaneous accomplished as is shown in Examples 1-2, 2-2 and 7-2.

It is considered that the described variation of the fluorescence spectrum results in the following functions and effects.

In each of Examples 1-2, 2-2 and 7-2, Compounds 8 and 10 were used as the electron-transporting material for the light-emitting layer 50. These electron-transporting materials have a structure containing a polycyclic aromatic group, and they have a tendency of shifting their fluorescence spectrum to the long wavelength side, because the polycyclic aromatic group has a two-dimensional structure and the two-dimensional structure may cause undesirable interactions between the molecules.

Shifting of the fluorescence spectrum is resulted based on the contribution of a high vibrational level in the molecule of the electron-transporting material containing electrons. As a result of contribution of the vibrational level, an effective energy gap between the electron-transporting material and the hole-transporting material is lowered, thereby enabling to easily transfer holes from the hole-transporting material to the electron-transporting material in the light-emitting layer.

As a result, the electron-transporting material is changed to the excitation state, thereby causing a reduction of the luminescence. Thus, it is contemplated that if the fluorescence spectrum of the electron-transporting material is shifted to the shorter wavelength side as described above, the above-described contribution of a high vibrational level can be inhibited, thereby resulting in the inhibition of the hole transfer from the hole-transporting material to the electron-transporting material in the light-emitting layer. Finally, it becomes possible to improve the luminescence durability.

In this connection, reference should be made to Example 8-6 in which Compound 10 was used as the electron-transporting material and its heating temperature was increased from 350° C. to 380° C. Further, the fluorescence spectrum of the thin layer of Compound 10 was controlled so that a peak or shoulder of the spectrum may be observed at a position which is 20 nm or less from the build-up value of the same spectrum.

However, in this example, a difference of the ionization potential between the hole-transporting material (Compound 3) and the electron-transporting material (Compound 10) is small as 0.25 eV. That is, the requirement for the electron-transporting material is not satisfied in this specific production process. Thus, in comparison with Example 8-3 using the same combination of the materials, the resulting luminescence durability is substantially the same in this example, though the increased heating temperature was applied in this example.

Examples of Second Embodiment

The organic EL device S1 illustrated in FIG. 2 was produced as in the examples of the first embodiment. In the formation of the light-emitting layer 50, the tertiary amine compound represented by the above formula (III), i.e., Compound 12 described above, were used as a hole-transporting material. Further, Compound 8 was used as an electron-transporting material and Compound 9 (styrylamine derivative capable of emitting blue color light) was used as a light-emitting additive material.

Compound 12 used herein was prepared as follows,

Compound 12

N,N'-bis(4-diphenylatninobiphenyl-4'-yl)-N,N'-diphenyl-4,4'-diamino-p-terphenyl 20.3 g (0.15 moles) of acetoanilide, 73.1 g (0.18 moles) of 4,4'-diiodobiphenyl, 22.1 g (0.16 moles) of anhydrous potassium carbonate, 2.16 g (0.034 moles) of copper powders and 35 ml of nitrobenzene were mixed, and the mixture was reacted at 190 to 205° C. for 10 hours.

The reaction product was extracted with 200 ml of toluene, the insoluble was filtered off, and the filtrate was concentrated to dryness. The solid product was purified on a column chromatography using silica gel as a carrier and toluene/ethyl acetate (6/1) as an eluting solution to obtain 37.2 g (yield; 60%) of N-(4'-iodobiphenyl-4-yl)acetoanilide.

Next, 13.2 g (0.032 moles) of N-(4'-iodobiphenyl-4-yl) acetoanilide, 6.60 g (0.039 moles) of diphenylamine, 5.53 g (0.040 moles) of anhydrous potassium carbonate, 0.45 g (0.007 moles) of copper powders and 10 ml of nitrobenzene were mixed, and the mixture was reacted at 200 to 212° C. for 15 hours.

The reaction product was extracted with 100 ml of toluene, the insoluble was filtered off, and the filtrate was concentrated to obtain an oily product. The oily product was dissolved in 60 ml of isoamyl alcohol, and 1 ml of water and 2.64 g (0.0040 moles) of 85% potassium hydroxide were added to the solution to cause a hydrolysis at 130° C. After water vapor distillation to remove isoamyl alcohol, the product was extracted with 250 ml of toluene, washed with water, and dried to obtain a concentrated product.

The concentrated product was purified on a column chromatography using silica gel as a carrier and toluene/n-hexane (1/2) as an eluting solution to obtain 9.2 g (yield: 70.0%) of 4-diphenylamino-4'-phenylaminobiphenyl.

Thereafter, 8.7 g (0.021 moles) of 4-diphenylamino-4'-phenylaminobiphenyl, 4.8 g (0.01 mole) of 4,4'-diiodo-p-terphenyl, 2.90 g (0.021 moles) of anhydrous potassium carbonate, 0.32 g (0.005 moles) of copper powders and 10 ml of nitrobenzene were mixed, and the mixture was reacted at 195 to 210° C. for 20 hours.

The reaction product was extracted with 140 ml of toluene, the insoluble was filtered off, and the filtrate was concentrated. 120 ml of n-hexane was added to the concentrated product to obtain a raw product. The raw product was purified on a column chromatography using silica gel as a carrier and toluene/n-hexane (1/2) as an eluting solution to obtain 4.7 g (yield: 45.0%) of N,N'-bis(4-diphenylaminobiphenyl-4'-yl)-N,N'-diphenyl-4,4'-diamino-p-terphenyl.

Properties of Compounds 8, 9 and 12

The properties of Compounds 8, 9 and 12 except for Compound 9 used as a light-emitting additive material are summarized as follows.

| Glass transition temperature (Tg): | |
|---|---|
| Compound 8: | 175° C. |
| Compound 12: | 151° C. |

As is appreciated, both of Compounds 8 and 12 used as a host in the formation of the light-emitting layer 50 satisfy the requirement for the glass transition temperature of at least 100° C.

| Ionization potential (Ip): | |
|---|---|
| Compound 8: | 5.85 eV |
| Compound 12: | 5.46 eV |

As is appreciated, both of Compounds 8 and 12 satisfy the requirement for the ionization potential of at least 5.45 eV. Note that the ionization potential was determined in the photoelectric measuring apparatus "AC-2" commercially available from Riken Keiki Kabushiki Kaisha.

Oxidation Potential:

The oxidation potential of Compound 12 was determined by applying a potential variation to a solution containing this compound (used as the hole-transporting material in the formation of the light-emitting layer) in accordance with the conventional cyclic voltammetric method.

As a result, it was determined that Compound 12 has the oxidation potential differences (difference between the first and second oxidation potentials) of 0.22V which satisfies the requirement for the oxidation potential difference of at least 0.22V.

Further, Compound 12 was examined with regard to the symmetry of the profile of the oxidation side curve and that of the reduction side curve in the oxidation-reduction characteristic curve plotted by the cyclic voltammetric method. As a result, it was observed that Compound 12 has symmetry in the oxidation side curve and the reduction side curve.

Evaluation of Compounds 8, 9 and 12

Using Compounds 8, 9 and 12 described above, the organic EL devices S1 illustrated in FIG. 2 were produced, and their device characteristics such as luminescence durability and emission efficiency were determined and evaluated in accordance with the methods described below. The results are summarized in the following Table 3.

TABLE 3

| Example | TEMP | HTM | ETM | LEAM | LD | HTS | EE | OPD (v) | SYM | Tg (° C.) | Ip (eV) |
|---|---|---|---|---|---|---|---|---|---|---|---|
| 9-1 | 260° C. | Comp. 12 | Comp. 8 | Comp. 9 | 0.9 | ○ | 5.5 | 0.22 | ○ | 151 | 5.46 |
| 9-2 | 280° C. | | | | 0.9 | | | | | | |

Referring to Table 3, the abbreviations used in the upper column represent the following items;

TEMP: heating temperature (° C.) of the electron-transporting material applied to the formation of the light-emitting layer 50 through vapor deposition;

HTM: hole-transporting material;

ETM: electron-transporting material;

LEAM: light-emitting additive material;

LD: luminescence durability;

HTS: high temperature storage;

EE: emission efficiency;

OPD: oxidation potential difference (V);

SYM: symmetry of the oxidation-reduction curve;

Tg: glass transition temperature (° C.); and

Ip: ionization potential (eV).

In the evaluation of the device characteristics, as in the examples of the first embodiment described above, the luminescence durability was determined referring to the normalized luminescence. The normalized luminescence was determined by subjecting the EL device produced in each example to a durability test under the following conditions: circumstance temperature of 85° C., initial luminescence of 400 cd/m² and 1/64 duty driving. For the normalization, the luminescence measured after driving of 400 hours was assigned as an initial luminescence of 1.

The high temperature storage is intended to represent a heat resistance at 100° C. or more, and was determined by subjecting the EL device to a storage test at 100° C. In this test, the device showing no generation of dark spots was evaluated to be ○, and the device showing some dark spots was evaluated to be x.

The emission efficiency represents an initial emission efficiency, i.e., the emission efficiency (cd/A) determined at the initial luminescence of 400 cd/m².

The oxidation potential difference, the symmetry of the oxidation-reduction curve, Tg and Ip represent an oxidation potential difference of the hole-transporting material, a symmetry of the oxidation side and the reduction side in the oxidation-reduction curve, a glass transition temperature and an ionization potential, respectively. Note in the column of the symmetry of the oxidation-reduction curve that ○ means presence of symmetry in the curve, and x means absence of symmetry in the curve.

EXAMPLES

Each of the examples in Table 3 described above is further described with regard to the production and examination of the EL device, Example 9-1

An ITO coating (transparent electrode) was formed as an anode 20 on the glass substrate 10, and a surface of the ITO coating was polished to obtain a surface roughness of Ra of about 1 nm and Rz of about 10 nm.

A hole-injecting layer 30 consisting of CuPc as an organic material having a crystallinity was formed at a thickness of 10 nm on the anode 20. Then, to form a hole-transporting layer 40, Compound 12 (tertiary amine compound) was deposited at a thickness of 20 nm on the hole-injecting layer 30.

A light-emitting layer 50 was formed at a thickness of 20 nm on the hole-transporting layer 40. The light-emitting layer 50 was formed from Compound 12 (tertiary amine compound), Compound 8 (electron-transporting material) and Compound 9 (light-emitting additive material) in a weight ratio of 60:20:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device.

The EL device was subjected to the durability test under the conditions: circumstance temperature of 85° C., initial luminescence of 400 cd/m$^2$ and 1/64 duty driving. The results described in Table 3 were obtained. Further, it was observed in the storage test under the circumstance temperature of 100° C. that no remarkable dark spot is generated over 500 hours, Example 9-2

The procedure of Example 9-1 was repeated with the proviso that, in the formation of the light-emitting layer 50, the heating temperature of compound 8 (electron-transporting material) was increased to 280° C.

The EL device was subjected to the durability test under the conditions: circumstance temperature of 85° C., initial luminescence of 400 cd/m$^2$ and 1/64 duty driving. The results described in Table 3 were obtained. Further, it was observed in the storage test under the circumstance temperature of 100° C. that no remarkable dark spot is generated over 500 hours.

Analysis of Examples

Each of the examples described above is further described with regard to the features and others based on the results described in Table 3.

As described in Table 3, in Examples 9-1 and 9-2, both of the tertiary amine compound as the hole-transporting material and the electron-transporting material used have a glass transition temperature of at least 100° C., and the tertiary amine compound as the hole-transporting material has an oxidation potential difference of at least 0.22V, Accordingly, the improvement in the luminescence durability and the establishment in the heat resistance at 100° C. or more can be simultaneously attained in these example.

That is, both of the requirements that the glass transition temperature of the tertiary amine compound as a hole-transporting material and the electron-transporting material is at least 100° C., and that the tertiary amine compound has an oxidation potential difference of at least 0.22V are satisfied in Examples 9-1 and 9-2. As a result, the improvement in the luminescence durability and the establishment in the heat resistance at 100° C. or more can be simultaneously attained in these example.

The improvement in the luminescence durability in Examples 9-1 and 9-2 will be appreciated by comparing the results of Table 3 with those of Examples 1-1 and 1-8 using the hole-transporting material having the oxidation potential difference of less than 0.22V described above with regard to the first embodiment of the present invention.

This is considered to be because the glass transition temperature of the hole-transporting material and the electron-transporting material in the light-emitting layer 50 is at least 100° C., and the requirement for the oxidation potential difference of at least 0.22V is satisfied. As a result, the hole transfer from the first oxidation potential to the second oxidation potential in the hole-transporting material is inhibited, thereby enabling to inhibit the hole transfer to the electron-transporting material and also inhibit the deterioration of the electron-transporting material.

Further, in Examples 9-1 and 9-2, in the formation of the light-emitting layer 50 from a mixed host, used is the tertiary amine compound having an ionization potential of 5.46 eV. That is, the used compound satisfies the requirement for the ionization potential of at least 5.45 eV. As a result, the satisfactory emission efficiency of the EL device can be ensured in comparison with the prior art EL devices.

The improvement in the emission efficiency in Examples 9-1 and 9-2 will be appreciated by comparing the results of Table 3 with those of Examples 4-1 and 5-1 using the tertiary amine compound having the ionization potential of less than 5.45 eV described above with regard to the first embodiment of the present invention.

Furthermore, in Examples 9-1 and 9-2, the extended luminescence durability can be ensured because the tertiary amine compound used exhibits a good symmetry in the oxidation-reduction curve. This effect will be appreciated by comparing the results of Table 3 with those of Examples 4-1 and 5-1 using the tertiary amine compound having asymmetric oxidation-reduction curve described above with regard to the first embodiment of the present invention.

In addition, it is noted that comparable physical properties and characteristics could be obtained in both of Examples 9-1 and 9-2. These results are considered to be because of using Compound 12, and thus they can be realized independent of the production process applied.

As described above, according to the second embodiment of the present invention, the improvement in the luminescence durability and the establishment in the heat resistance at 100° C. or more can be simultaneously realized in the formation of the light-emitting layer 50 from a mixed host by using as the electron-transporting material compounds having a glass transition temperature of at least 100° C., and also using as the hole-transporting material the tertiary amine compound represented by the formula (III).

Examples of Third Embodiment

The organic EL device S1 illustrated in FIG. 2 was produced as in the examples of the first and second embodiments. In the formation of the light-emitting layer 50, the tertiary amine compound represented by the above formula (III), i.e., Compound 12 described above, was used as a hole-transporting material, Further, Compound 8 was used as an electron-transporting material. Compound 9 (styrylamine derivative capable of emitting blue color light) and Compound 13 (rubrene) represented by the following formula were used as a light-emitting additive material.

Compound 13

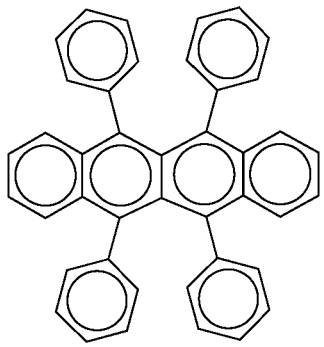

Compound 13

Evaluation of Compounds 8, 9, 12 and 13

Using Compounds 8, 9, 12 and 13 described above, the organic EL devices S1 illustrated in FIG. 2 were produced, and their device characteristics such as luminescence durability and emission efficiency were determined and evaluated in accordance with the methods described below. The results are summarized in the following Table 4.

TABLE 4

| Example | TEMP | HTM | ETM | LEAM | Mixing ratio of anode side | Mixing ratio of cathode side | LD | HTS | EE |
|---|---|---|---|---|---|---|---|---|---|
| 10-1 | 260° C. | Comp. 12 | Comp. 8 | Comp. 9 | 60:20 | 60:20 | 0.9 | ○ | 5.5 |
| 10-2 | | | | | 60:30 | 60:15 | 0.98 | ○ | 6.5 |
| 11-1 | 260° C. | Comp. 12 | Comp. 8 | Comp. 9, 13 | 60:20 | 60:20 | 0.9 | ○ | 5.5 |
| 11-2 | | | | | 60:30 | 60:15 | 1 | ○ | 6.5 |

Referring to Table 4, the abbreviations used in the upper column represent the following items:

TEMP: heating temperature (° C.) of the electron-transporting material applied to the formation of the light-emitting layer 50 through vapor deposition;

HTM: hole-transporting material;

ETM: electron-transporting material;

LEAM: light-emitting additive material;

Mixing ratio of anode side: a mixing ratio of the electron-transporting material to the hole-transporting material;

Mixing ratio of cathode side; a mixing ratio of the electron-transporting material to the hole-transporting material;

LD: luminescence durability;

HTS: high temperature storage; and

EE: emission efficiency.

In the evaluation of the device characteristics, as in the examples of the first and second embodiments described above, the luminescence durability was determined referring to the normalized luminescence. The normalized luminescence was determined by subjecting the EL device produced in each example to a durability test under the following conditions: circumstance temperature of 85° C., initial luminescence of 400 cd/m² and 1/64 duty driving. For the normalization, the luminescence measured after driving of 400 hours was assigned as an initial luminescence of 1.

The high temperature storage is intended to represent a heat resistance at 100° C. or more, and was determined by subjecting the EL device to a storage test at 100° C. In this test, the device showing no generation of dark spots was evaluated to be ○, and the device showing some dark spots was evaluated to be x.

The emission efficiency represents an initial emission efficiency, i.e., the emission efficiency (cd/A) determined at the initial luminescence of 400 cd/m².

EXAMPLES

Each of the examples in Table 4 described above is further described with regard to the production and examination of the EL device.

Example 10-1

An ITO coating (transparent electrode) was formed as an anode 20 on the glass substrate 10, and a surface of the ITO coating was polished to obtain a surface roughness of Ra of about 1 nm and Rz of about 10 nm.

A hole-injecting layer 30 consisting of CuPc as an organic material having a crystallinity was formed at a thickness of 10 nm on the anode 20. Then, to form a hole-transporting layer 40, Compound 12 (tertiary amine compound) was deposited at a thickness of 20 nm on the hole-injecting layer 30.

A light-emitting layer 50 was formed at a thickness of 20 nm on the hole-transporting layer 40. The light-emitting layer 50 was formed from Compound 12 (tertiary amine compound), Compound 8 (electron-transporting material) and Compound 9 (light-emitting additive material) in a weight ratio of 60:20:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device.

The EL device was subjected to the durability test under the conditions; circumstance temperature of 85° C., initial luminescence of 400 cd/m² and 1/64 duty driving. The results described in Table 4 were obtained. Further, it was observed in the storage test under the circumstance temperature of 100° C. that no remarkable dark spot is generated over 500 hours.

Example 10-2

An ITO coating (transparent electrode) was formed as an anode 20 on the glass substrate 10, and a surface of the ITO coating was polished to obtain a surface roughness of Ra of about 1 nm and Rz of about 10 nm.

A hole-injecting layer 30 consisting of CuPc as an organic material having a crystallinity was formed at a thickness of 10 nm on the anode 20. Then, to form a hole-transporting layer 40, Compound 12 (tertiary amine compound) was deposited at a thickness of 20 nm on the hole-injecting layer 30.

A light-emitting layer 50 was formed at a thickness of 20 nm on the hole-transporting layer 40, The light-emitting layer was first deposited at a thickness of 10 nm from Compound 12 (tertiary amine compound), Compound 8 (electron-transporting material) and Compound 9 (light-emitting additive material) in a weight ratio of 60:30:3, followed by depositing at a thickness of 10 nm from Compound 12, compound 8 and Compound 9 in a weight ratio of 60:15:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device.

The EL device was subjected to the durability test under the conditions: circumstance temperature of 85° C., initial luminescence of 400 cd/m$^2$ and 1/64 duty driving. The results described in Table 4 were obtained. Further, it was observed in the storage test under the circumstance temperature of 100° C. that no remarkable dark spot is generated over 500 hours.

It is noted in Example 10-2 that the light-emitting layer 50 was formed as a laminated structure consisting of two light-emitting layer having different mixing ratios of the hole-transporting material and a mixing ratio of the hole-transporting material was varied in the formation of the light-emitting layer so that in comparison with that of Example 10-1, its mixing ratio is larger in a side of the anode 20 than that in a side of the cathode 80.

With regard to the hole-transporting material, when it contains four triphenylamines in the molecule thereof as is suggested by the present invention, the hole-transporting material generally has an increased carrier density and a relatively rapid mobility. Therefore, a variation of the hole mobility from the hole-transporting layer 40 to the light-emitting layer 50 is remarkably large, and thus the transfer speed of holes is rapidly lowered in the mobility-varied portion of the layers. Therefore, it is considered that holes can be also transferred to the electron-transporting material in the light-emitting layer during transfer of holes from the hole-transporting layer to the light-emitting layer.

Contrary to this, according to the present invention, since the mixing ratio of the hole-transporting material was stepwise varied to inhibit a rapid variation of the hole mobility, a probability of the hole transfer to the electron-transporting material can be lowered, thereby improving the luminescence durability.

Example 11-1

An ITO coating (transparent electrode) was formed as an anode 20 on the glass substrate 10, and a surface of the ITO coating was polished to obtain a surface roughness of Ra of about 1 nm and RZ of about 10 nm.

A hole-injecting layer 30 consisting of CuPc as an organic material having a crystallinity was formed at a thickness of 10 nm on the anode 20. Then, to form a hole-transporting layer 40, Compound 12 (tertiary amine compound) was deposited at a thickness of 20 nm on the hole-injecting layer 30.

A light-emitting layer 50 was formed at a thickness of 20 nm on the hole-transporting layer 40. The light-emitting layer was first deposited at a thickness of 10 nm from Compound 12 (tertiary amine compound), Compound 8 (electron-transporting material) and Compound 13 (light-emitting additive material) in a weight ratio of 60:20:3, followed by depositing at a thickness of 10 nm from Compound 12, Compound 8 and Compound 9 (light-emitting additive material) in a weight ratio of 60:20:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device. The EL device emitted white color light as a result of mixing of blue color light and yellow color light.

The EL device was subjected to the durability test under the conditions: circumstance temperature of 85° C., initial luminescence of 400 cd/m$^2$ and 1/64 duty driving. The results described in Table 4 were obtained. Further, it was observed in the storage test under the circumstance temperature of 100° C. that no remarkable dark spot is generated over 500 hours.

Example 11-2

An ITO coating (transparent electrode) was formed as an anode 20 on the glass substrate 10, and a surface of the ITO coating was polished to obtain a surface roughness of Ra of about 1 nm and Rz of about 10 nm.

A hole-injecting layer 30 consisting of CuPc as an organic material having a crystallinity was formed at a thickness of 10 nm on the anode 20. Then, to form a hole-transporting layer 40, Compound 12 (tertiary amine compound) was deposited at a thickness of 20 nm on the hole-injecting layer 30.

A light-emitting layer 50 was formed at a thickness of 20 nm on the hole-transporting layer 40. The light-emitting layer was first deposited at a thickness of 10 nm from Compound 12 (tertiary amine compound), Compound 8 (electron-transporting material) and Compound 13 (light-emitting additive material) in a weight ratio of 60:30:3, followed by depositing at a thickness of 10 nm from Compound 12, Compound 8 and Compound 9 (light-emitting additive material) in a weight ratio of 60;15:3. The heating temperature of Compound 8 as the electron-transporting material was adjusted to 260° C.

Thereafter, a 20 nm-thick electron-transporting layer 60 consisting of tris(8-hydroxyquinolirato)aluminum, an electron-injecting layer 70 consisting of LiF and an aluminum cathode 80 were deposited, in sequence, on the light-emitting layer 50, and the laminated product was sealed in a sealing can in an atmosphere of dry nitrogen to obtain an organic EL device. The EL device emitted white color light as a result of mixing of blue color light and yellow color light.

The EL device was subjected to the durability test under the conditions: circumstance temperature of 85° C., initial luminescence of 400 cd/m² and 1/64 duty driving. The results described in Table 4 were obtained. Further, it was observed in the storage test under the circumstance temperature of 100° C. that no remarkable dark spot is generated over 500 hours.

Examples 11-1 and 11-2 evidence that the comparably satisfactory effects according to the third embodiment of the present invention can be obtained even if the light-emitting layer is formed as a laminated structure of two more light-emitting layers having different emission colors in place of application of the single light-emitting layer.

The invention claimed is:

1. An organic electroluminescent device comprising a light-emitting layer between a pair of electrodes, the light-emitting layer comprising a mixture of a hole-transporting material consisting of a tertiary amine compound, an electron-transporting material and a light-emitting additive material, in which said electron-transporting material has a glass transition temperature of at least 100° C., and said tertiary amine compound is a compound represented by the following formula (III):

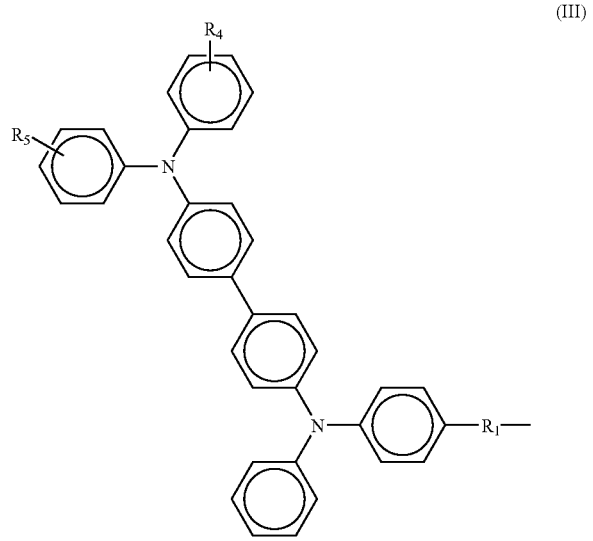

(III)

-continued

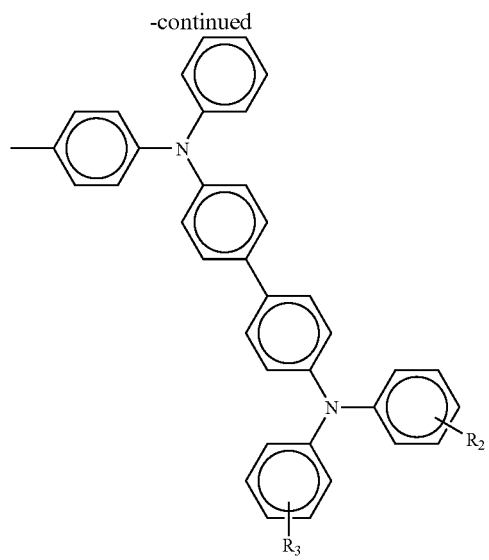

in which
R₁ is a group represented by the following formula (IV) or (V):

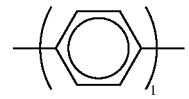

(IV)

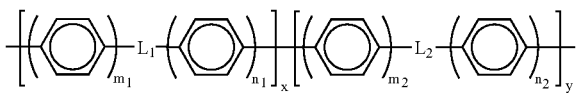

(V)

wherein 1, $m_1$, $m_2$, $n_1$ and $n_2$ each is an integer of at least 1, x is an integer of at least 1, y is 0 or an integer of at least 1, and $L_1$ and $L_2$ independently represent an acene compound group, and $R_2$, $R_3$, $R_4$ and $R_5$ independently represent a hydrogen atom, an alkyl group or an aryl group.

2. An organic electroluminescent device as defined in claim 1, in which said electron-transporting material shows a difference in the ionization potential between the same and said hole-transporting material of 0.35 eV or more.

3. An organic electroluminescent device as defined in claim 1, in which said tertiary amine compound is a compound represented by the following formula (VI):

(VI)

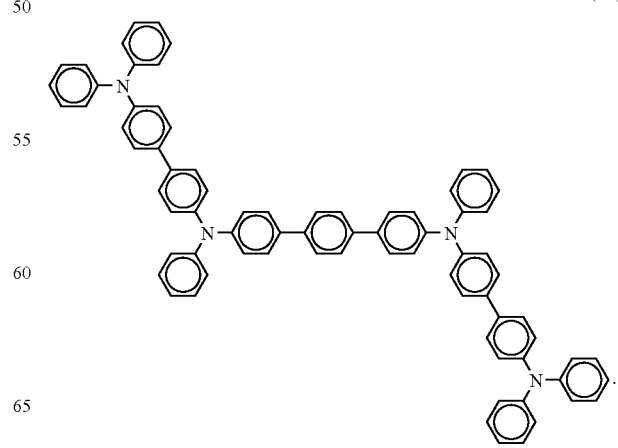

4. An organic electroluminescent device as defined in claim 3, in which said electron-transporting material shows a difference in the ionization potential between the same and said hole-transporting material of 0.35 eV or more.

5. An organic electroluminescent device as defined in claim 1, in which said light-emitting layer has a laminated structure consisting of two or more layers having different mixing ratios of said hole-transporting material, and a mixing ratio of said hole-transporting material in a side of the anode in said pair of the electrodes is larger than that in a side of the cathode in the electrodes.

6. An organic electroluminescent device as defined in claim 5, in which the two or more layers of said light-emitting layer each has different types of said light-emitting additive material added thereto.

* * * * *